US012388239B2

(12) United States Patent
Shearman et al.

(10) Patent No.: US 12,388,239 B2
(45) Date of Patent: Aug. 12, 2025

(54) NETWORK ELEMENT EQUIPMENT SHELF WITH CONFIGURABLE POWER LOCATION

(71) Applicant: Ciena Corporation, Hanover, MD (US)

(72) Inventors: Simon J. Shearman, Carleton Place (CA); Raymond Quintal, Stittsville (CA); Jacques Cote, Nepean (CA); Daniel Rivaud, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 18/669,687

(22) Filed: May 21, 2024

(65) Prior Publication Data

US 2024/0305073 A1   Sep. 12, 2024

Related U.S. Application Data

(63) Continuation of application No. 17/479,062, filed on Sep. 20, 2021, now Pat. No. 12,021,355, which is a continuation-in-part of application No. 17/068,049, filed on Oct. 12, 2020, now Pat. No. 11,303,106.

(51) Int. Cl.
  *H02B 1/00*    (2006.01)
  *H02B 1/20*    (2006.01)
  *H02B 1/56*    (2006.01)
  *H05K 7/02*    (2006.01)

(52) U.S. Cl.
  CPC ............... *H02B 1/20* (2013.01); *H02B 1/56* (2013.01); *H05K 7/02* (2013.01)

(58) Field of Classification Search
  CPC ....................................................... H02G 5/04
  See application file for complete search history.

(56) References Cited

U.S. PATENT DOCUMENTS

| 5,213,518 A | * | 5/1993 | Weidler | ............... H01R 25/162 439/211 |
| 6,359,770 B1 | * | 3/2002 | Kolody | ................... H04Q 1/10 361/833 |
| 6,381,123 B1 | * | 4/2002 | Gerken | .................. H02B 1/056 361/652 |
| 7,037,143 B2 | | 5/2006 | Aziz et al. | |

(Continued)

OTHER PUBLICATIONS

Mar. 14, 2024 List of References in corresponding U.S. Appl. No. 17/479,062.

*Primary Examiner* — Pete T Lee
(74) *Attorney, Agent, or Firm* — Clements Bernard Walker; Christopher L. Bernard

(57) ABSTRACT

A network device includes a support structure configured to support communication equipment, the support structure including at least a non-conductive vertical substrate, a pair of conductive strips arranged on a front-facing surface of the non-conductive vertical substrate and configured in electrical communication with a power source, and one or more alignment blocks, where each of the one or more alignment blocks includes a touch-proof cage configuration that has spacing dimensions configured to prevent a normal-sized human finger from contacting the pair of conductive strips to reduce the risk of electric shock. Each of the one or more alignment blocks includes slots configured to guide one or more power connectors of a circuit board for making electrical contact with the pair of conductive strips when the circuit board is installed on the support structure.

20 Claims, 25 Drawing Sheets

(56) References Cited

U.S. PATENT DOCUMENTS

| | | |
|---|---|---|
| 7,042,716 B2 | 5/2006 | Shearman |
| 9,203,782 B2 | 12/2015 | Mayenburg et al. |
| 9,769,959 B2 | 9/2017 | Mayenburg et al. |
| 2003/0184974 A1 | 10/2003 | Atkinson et al. |
| 2005/0074990 A1 | 4/2005 | Shearman et al. |
| 2005/0075001 A1 | 4/2005 | Shearman et al. |
| 2007/0114056 A9 | 5/2007 | Cosman et al. |
| 2011/0038103 A1* | 2/2011 | Hudgins, Jr. ............ H02B 1/21 |
| | | 361/637 |
| 2011/0222241 A1 | 9/2011 | Shearman et al. |
| 2016/0156162 A1* | 6/2016 | Yamaguchi .............. H05K 7/02 |
| | | 361/624 |

* cited by examiner

NETWORK ELEMENT EQUIPMENT SHELF WITH CONFIGURABLE POWER LOCATION

CROSS-REFERENCE

The present disclosure is a continuation (CON) of U.S. patent application Ser. No. 17/479,062, filed Sep. 20, 2021, which is a continuation-in-part (CIP) of U.S. patent application Ser. No. 17/068,049, filed Oct. 12, 2020, the contents of both of which are incorporated by reference in their entirety.

TECHNICAL FIELD

The present disclosure generally relates to busbar assemblies for providing electrical power to communications equipment. More particularly, the present disclosure relates to a network element equipment shelf with a configurable power location.

BACKGROUND

Communication systems (e.g., optical networking devices, data networking devices, wireless networking devices, storage devices, compute devices, and generally any type of processing equipment that may be deployed in Data Centers, Central Offices, and the like) are typically mounted on a shelf or rack structure. Typically, these shelves might have a depth of about one meter or more. However, as the need for more compact equipment arises, some shelf systems have been created with a depth that is about half (e.g., 600 mm) of conventional shelves. In addition to a more compact form, power demands are also increasing, which results in greater power densities within new generations of network communication systems. These new platforms being developed are more compact in depth and higher in power demands.

Also, power distribution in shelf-mounted equipment is an issue that must be addressed in this environment. In previous and current generations, power is normally distributed throughout the communication equipment using some type of power supply that includes a solid copper busbar. The busbar carries power to various circuit boards on the shelf and is usually covered by a perforated cage for safety. Conventional busbar systems, which include the busbars and the protective cages, are usually positioned at the back of a shelf about halfway between the two back posts of the shelf.

As demands continue to increase with respect to size and electrical power, the power demands have become too high to run power planes within a power structure of a backplane circuit board. Also, beyond a certain point, it is no longer practical to keep adding layers to a circuit board substrate (e.g., midplane) to increase its power carrying capacity.

Usually, busbars are positioned at the back of a shelf system and include a "floating" connector. In this sense, a floating connector is a connector that is not fixed in a specific position, but may include cables, for example, that are flexible and can be moved around or positioned anywhere within a certain space. Therefore, when a circuit board is installed onto a shelf, the circuit board may be slid into a slot until signal connectors on the circuit board engage with corresponding signal connectors on a vertical backplane. Since power connection is usually not considered at this point, it is then necessary to connect power connectors of the circuit board with corresponding power connectors of a busbar system, which usually involves physically and electrically matching cable connections as needed. These floating power cables (e.g., six-gauge wires or greater) may be quite large and take up a significant amount of space. Therefore, with this conventional power supply system, it becomes difficult to utilize these large power supply components within more recently developed shelf systems having a more compact size.

Another thing to consider in this field of shelf-mounted communication systems is the issue of heat. With shelves becoming more compact and with power increasing, the greater power densities in smaller spaces can produce large amounts of heat that needs to be removed from the system to keep temperatures at proper levels. Fans are typically mounted on shelf systems to blow air across the communication equipment to reduce the risk of overheating.

Therefore, there is a need in the field of shelf-mounted communication systems, particularly those having a smaller size shelf, to streamline the design of the power supplies to allow air flow to pass by the busbars without bulky power supply equipment blocking the air flow. Also, there is a need to provide power supply systems and busbar systems where connection with circuit boards can be simplified and where the risk of electric shock is minimized.

Also, network element shelves are provided in a single configuration where the power is fixed to enter the top or bottom of the shelf. An example network element shelf can be a switching platform (e.g., packet). An external fabric switching shelf can include an external fabric switching shelf with power at the top or bottom of two shelves in a frame/cabinet, however there is a requirement for longer cables (e.g., Quad Small-Form Factor Pluggable (QSFP) Direct Attach Copper (DAC) cables) that need to traverse a power section in the middle of the frame. The QSFP DAC cables are electrical with a high-speed twinax cable with QSFP+ connector on either end of the cable, and these cables must be as short as possible to maintain signal integrity and keep costs down. The longer the cable the more the cost and the worse signal integrity. Decreasing DAC cable length has a significant effect on system cost because of the large number of cables. A 192Tbps system can have 320 DAC switching cables. This is not a modular approach; form factor cannot grow.

BRIEF SUMMARY

The present disclosure relates to a network element equipment shelf with a configurable power location. The present disclosure includes a telecom/data equipment shelf that can be configured to allow power supplies to be plugged into the top or the bottom of the shelf, such that a top frame mounted shelf can have power supplies at the top, while a bottom frame mounted shelf can have power supplies at the bottom of the shelf. Right-angle busbar extensions and extension backplanes allow the shelves to mate behind the plane of the main backplane, which increases space efficiency. The shelf can include multiple power slots each of which provides multiple slots of power supplies. This is a novel modular approach that allows the shelf form factor to change over time—for example to increase in height if more power is required in future. Furthermore, the power supplies and their cabling is decoupled from the main chassis. This enables a unique "wall of fans" that maximizes cooling to the traffic-carrying cards.

Also, the present disclosure is directed to various systems for carrying electrical power from a power source to a circuit board. These systems may include busbar assemblies that are arranged on a front face of a vertical-oriented non-conductive substrate, such as a backplane or midplane of a shelf or cabinet that houses networking equipment. The busbar assembly, for example, may include a pair of conductive busbar strips that are arranged in a parallel orientation to minimize the amount of surface space on the non-conductive substrate, which may especially be important for enabling air flow through shelf systems having an overall reduced size. The conductive strips are held in place by a plurality of non-conductive (e.g., plastic) modules, which may be configured as blocks that surround the pair of conductive busbar strips. These non-conductive modules are not only configured to align the busbar strips in a fixed position with respect to the vertical substrate to allow blind power connection, but are also configured to reduce the risk of electric shock by a user who may be installing circuit packs or circuit boards onto the network device on which the vertical substrate is supported.

According to one embodiment of the present disclosure, a network device may be provided that includes a support structure for supporting communication equipment, where the support structure may include at least a non-conductive vertical substrate, a power source, and a pair of conductive strips arranged on a front-facing surface of the non-conductive vertical substrate and configured in electrical communication with the power source. The network device may further include one or more alignment blocks configured to hold the pair of conductive strips in a fixed position with respect to the non-conductive vertical substrate. Each of the one or more alignment blocks may be configured to guide one or more power connectors of a circuit board for making electrical contact with the pair of conductive strips when the circuit board is being installed on the support structure.

According to another embodiment of the present disclosure, a busbar assembly includes a pair of conductive strips configured to carry electrical power. The pair of conductive strips are arranged on a front-facing surface of a non-conductive vertical substrate. The busbar assembly further includes one or more alignment blocks configured to hold the pair of conductive strips in a fixed position with respect to the non-conductive vertical substrate. Each of the one or more alignment blocks is configured to guide a pair of power connectors of a circuit board for making electrical contact with the pair of conductive strips when the circuit board is being installed in a housing.

According to another embodiment of the present disclosure, a power supply for a network element is provided. The power supply includes a pair of conductive strips configured to carry electrical power from one or more power modules mounted on a housing for supporting the network element, where the pair of conductive strips are arranged on a front-facing surface of a non-conductive vertical substrate. One or more alignment blocks are configured to hold the pair of conductive strips in a fixed position with respect to the non-conductive vertical substrate. Each of the one or more alignment blocks is configured to guide a pair of power connectors of a circuit board for making electrical contact with the pair of conductive strips when the circuit board is being installed on the housing.

According to yet another embodiment of the present disclosure, a protective module of a busbar assembly with built-in alignment features is described. The protective module may include a non-conductive block configured to hold a pair of conductive strips in a fixed position on a front-facing surface of a non-conductive vertical substrate, the pair of conductive strips being configured to carry electrical power. The protective module provides tight alignment of the conductive vertical strips with respect to the non-conductive vertical substrate. The non-conductive vertical substrate may be an outer layer of a backplane circuit board containing a similar array of electrical signal connectors. The tight tolerance of the protective modules allows substantially simultaneous blind mating of the power connections into the vertical busbars and electrical signal connections on another portion of the continuous backplane circuit board. In some embodiments, the protective module may also include a non-conductive cage arranged on a front-face of the non-conductive block. The non-conductive cage may be configured to guide a pair of power connectors of a circuit board for making electrical contact with the pair of conductive strips when the circuit board is being installed on a housing configured to support communication equipment.

BRIEF DESCRIPTION OF THE DRAWINGS

The present disclosure is illustrated and described herein with reference to the various drawings. Like reference numbers are used to denote like components/steps, as appropriate. Unless otherwise noted, components depicted in the drawings are not necessarily drawn to scale.

DETAILED DESCRIPTION

Figure 1:
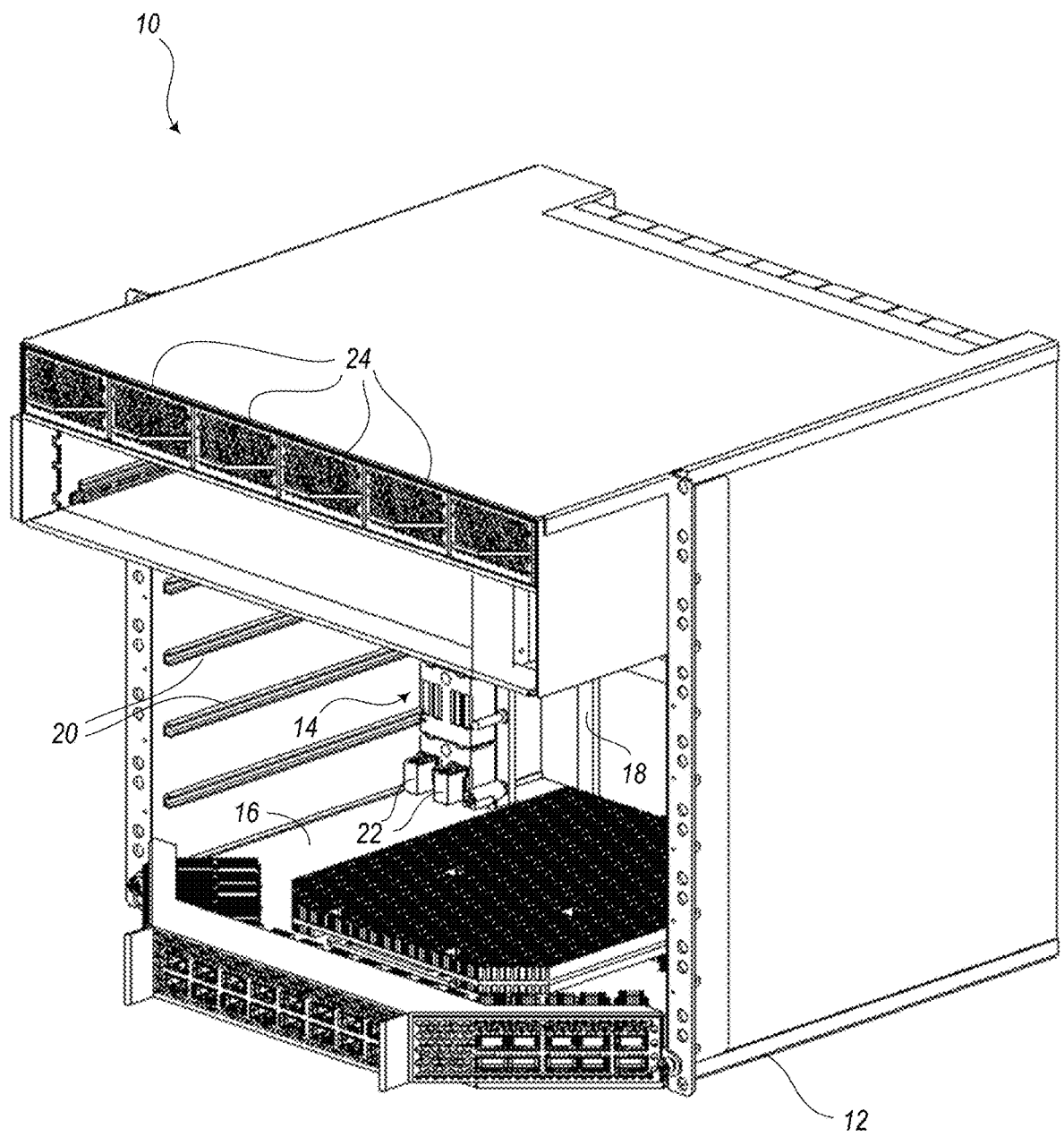
FIG. 1 is a diagram illustrating a front perspective view of networking equipment installed on a network device, according to various embodiments of the present disclosure.

The present disclosure relates to a network element equipment shelf with a configurable power location. The present disclosure includes a telecom/data equipment shelf that can be configured to allow power supplies to be plugged into the top or the bottom of the shelf, such that a top frame mounted shelf can have power supplies at the top, while a bottom frame mounted shelf can have power supplies at the bottom of the shelf. Right-angle busbar extensions and extension backplanes allow the shelves to mate behind the plane of the main backplane, which increases space efficiency. The shelf can include multiple power slots each of which provides multiple slots of power supplies. This is a novel modular approach that allows the shelf form factor to change over time—for example to increase in height if more power is required in future. Furthermore, the power supplies and their cabling is decoupled from the main chassis. This enables a unique "wall of fans" that maximizes cooling to the traffic-carrying cards.

Busbar Assembly with Alignment and Touch-Proof Features for Network Elements

Also, the present disclosure relates to busbar systems and power supply system for carrying large amounts of electrical power from a power source to multiple communication devices (e.g., circuit packs, circuit cards, circuit boards, modules, blades, servers, etc.) mounted on a housing (e.g., shelf, rack, cabinet, chassis, or other structure for supporting networking equipment). The busbar systems disclosed herein may be especially useful in network device systems having a more compact structure as compared to conventional network device systems. For example, more compact shelves may be configured with a depth of about 600 mm, as opposed to conventional shelves having a depth of about 1.0 meter or more.

The 600 mm depth is a traditional depth for telecommunications equipment in North America and Europe. Deeper systems with busbars were developed later with the inception of data centers with nominal height of one Rack Unit (1RU) pizza box equipment installations. These systems typically require a lot of power distribution. Telecom service providers may wish to have the option of installing new equipment in traditional 600 mm deep line-ups without having to create new deeper line-ups where they did not exist before. Building a 600 mm deep system allows it to be installed in telecommunications and data center environments. Since the function of newer systems are converging to handle both telecommunications and data traffic, they benefit from being installed in either environment.

The embodiments of the present disclosure include alignment mechanisms for accurately mounting a busbar system to a non-conductive vertically-oriented substrate, such as a backplane or midplane. Also, with precise positioning of the busbar system with respect to a network device, a circuit board can be installed onto the network device for blind mating of both signal connectors as well as power connectors of the circuit board with a respective busbar system. In this way, the circuit board can be installed such that signal connectors and power connectors can be connected to corresponding connectors at the same time in one step.

It should be noted that the term "non-conductive," when used to describe the various substrates throughout the present disclosure, may refer to substrates that are completely non-conductive, but may also refer to substrates having conductive and non-conductive layers. For example, some substrates may have outer layers that are non-conductive, while internal layers may be conductive or include conductive circuit traces, electrical connectors, etc.

In particular, the present disclosure describes embodiments in which a busbar system includes two conductive strips arranged vertically on a front face of the non-conductive vertical substrate (e.g., backplane, midplane, or other substrate of a shelf system). In addition, the busbar system may include a plurality of alignment blocks that are attached to the non-conductive substrate. These alignment blocks are used to hold the conductive strips in place with respect to the non-conductive substrate and allow power connectors fixedly mounted on a circuit board to electrically contact the conductive strips to receive power. Not only do the alignment blocks align the power connectors between the corresponding circuit board and substrate, but also the alignment blocks are configured with a large enough space to allow air flow but small enough where the risk of electric shock is reduced.

The busbar systems described in the present disclosure may have a form factor that is able to meet the present power demands and power density of new generations of communication platforms and optical communication equipment, even with systems that are more compact in depth and high in power demands. The embodiments herein are configured for implementation in vertical busbar distribution systems having depths of 600 mm or greater. It may be preferred to form the shelf systems with a 600 mm depth so they can fit in existing 600 mm deep line-ups, and avoid creating a new data center type line-up that is deeper than 600 mm. Nevertheless, the busbar systems described in the present disclosure provide a benefit over traditional busbar systems in that the traditional systems would require too much valuable board and cooling space to implement.

Conventional busbar systems may typically require about 150 mm of depth just to deliver power to circuit cards/servers that plug into the front of a busbar system. These conventional systems are typically mounted to a shelf or rack such that mating equipment needs to have floating power connectors to be able to mate to the vertical busbars without misalignment crashing. Again, these floating connections typically require thick gauge copper wires that are typically mounted to the surface of the circuit board (e.g., Printed Circuit Board Assembly (PCBA)), which themselves mate with the rack-mounted busbar system. Landing these wires of these conventional systems may take vast amounts of area from the circuit board on which they are mounted. The embodiments of the present disclosure may therefore be configured as "non-floating" components and hence are able to overcome the above-stated issues with the conventional systems.

There has thus been outlined, rather broadly, the features of the present disclosure in order that the detailed description may be better understood, and in order that the present contribution to the art may be better appreciated. There are additional features of the various embodiments that will be described herein. It is to be understood that the present disclosure is not limited to the details of construction and to the arrangements of the components set forth in the following description or illustrated in the drawings. Rather, the embodiments of the present disclosure may be capable of other implementations and configurations and may be practiced or carried out in various ways. Also, it is to be understood that the phraseology and terminology employed are for the purpose of description and should not be regarded as limiting.

As such, those skilled in the art will appreciate that the inventive conception, upon which this disclosure is based, may readily be utilized as a basis for the designing of other structures, methods, and systems for carrying out the several purposes described in the present disclosure. Those skilled in the art will understand that the embodiments may include various equivalent constructions insofar as they do not depart from the spirit and scope of the present invention. Additional aspects and advantages of the present disclosure will be apparent from the following detailed description of exemplary embodiments which are illustrated in the accompanying drawings.

FIG. 1 is a front perspective view showing an embodiment of networking equipment 10, namely a network device, installed on a shelf 12, only a portion of which is shown in FIG. 1. The shelf 12 (or the illustrated portion of the shelf) may also be configured as and/or referred to as chassis, or other suitable type vertical housing structure. Similar to other types of housings for supporting electrical equipment, the shelf 12 may require some type of cooling modules to keep the network equipment 10 from overheating. For example, one or more fans (not shown) or other types of cooling modules may be mounted on the shelf 12 to produce air flow through the shelf 12. The fans or cooling modules may be positioned at the rear of the shelf 12 and configured to cause air to flow in a back-to-front or front-to-back direction.

To avoid wasting valuable system space, a busbar assembly, or busbar system 14 (only a portion of which is visible in FIG. 1), is configured to provide a novel way to distribute power to one or more circuit boards, such as circuit board 16. The busbar system 14 is configured to mount to a front face of a vertically-oriented non-conductive substrate 18 (e.g., midplane, backplane, etc.). The side edges of the circuit board 16 can be slid along support rails 20 on an inside surface of side panels of the shelf 12. When fully pushed backward into the shelf 12, power connectors 22 mounted on the circuit board 16 can be electrically plugged in the busbar system 14 to attain power from the busbar system 14.

The busbar system 14 is designed to allow simultaneous insertion of both power connections 22 on one side (e.g., left side) of the circuit board 16 into the busbar system 14 along with the insertion of signal connectors (not shown) on another side (e.g., right side) of the circuit board 16 into corresponding signal connectors on the non-conductive substrate 18. High power busbars (not shown in FIG. 1) of the busbar system 14 are also configured to be covered in such a way as to make them touch-proof so that someone close to the non-conductive substrate 18 does not stick a finger into the busbar system 14 and receive a dangerous electrical shock.

Also shown in FIG. 1 are six power modules 24 arranged in a horizontal row on the shelf 12. The power modules 24 may be configured to receive electrical power from a power source and provide power to electrically conductive busbars of the busbar system 14. As described in more detail below, the electrically conductive busbars are arranged to enable connection of the power connectors 22 of the circuit board 16 with the busbar system 14.

Figure 2:
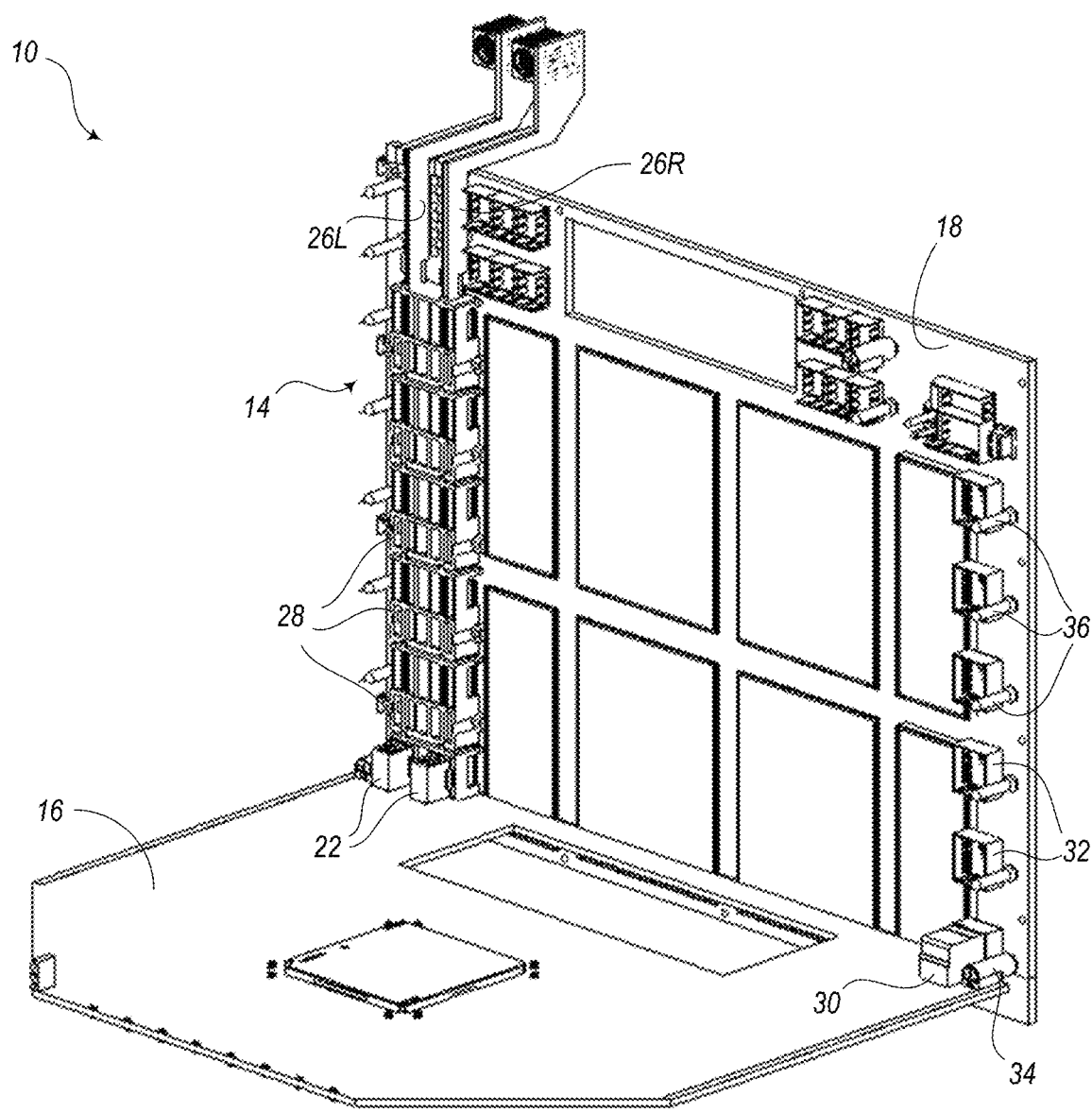
FIG. 2 is a diagram illustrating a front perspective view of a portion of the networking equipment of FIG. 1, where a circuit board is connected to a non-conductive substrate, according to various embodiments of the present disclosure.

FIG. 2 is a front perspective view showing an embodiment of a portion of the networking equipment 10 of FIG. 1. In this embodiment, the circuit board 16 is connected to the non-conductive substrate 18, which is shown more fully in FIG. 2. When the circuit board 16 is fully inserted into the vertically-oriented non-conductive substrate 18, the power connectors 22 of the circuit board 16 are configured to be connected to conductive busbars (e.g., conductive strips 26L, 26R) of the busbar system 14, whereby connection is made through a respective alignment block 28 (or protective module) that is installed over the busbars or conductive strips 26L, 26R. Also, during installation of the circuit board 16, a signal connector 30 on the circuit board 16 is configured to engage with a corresponding signal connector 32 of a plurality of signal connectors 32 in matching arrangement on the front face of the non-conductive substrate 18. Also, alignment tubes 34 on both sides of the circuit board 16 are configured to engage with corresponding alignment pins 36 extending from the front face of the non-conductive substrate 18 for properly aligning the circuit board 16 in order that the power connectors 22 and signal connector 30 can be inserted in the corresponding alignment block 28 and signal connector 32.

Therefore, according to some embodiments, the shelf 12 may include a support structure for supporting communication equipment (e.g., network equipment 10), the support structure including at least the non-conductive vertical substrate 18. The shelf 12 may also include a power source (not shown in FIG. 2) and the pair of conductive strips 26L, 26R configured to carry electrical power, where the pair of conductive strips 26L, 26R may be arranged on a front-facing surface of the non-conductive vertical substrate 18 and configured in electrical communication with the power source. The shelf 12 may also include one or more alignment blocks 28 configured to hold the pair of conductive strips 26L, 26R in a fixed position with respect to the non-conductive vertical substrate 18. One or more circuit boards (e.g., circuit board 16) may each have a pair of power connectors 22, wherein each of the one or more alignment blocks 28 is configured to guide the pair of power connectors 22 of a respective circuit board 16 of the one or more circuit boards for making electrical contact with the pair of conductive strips 26L, 26R when the respective circuit board 16 is being installed on the support structure.

Furthermore, the various embodiments of the shelf 12 of the present disclosure may be configured such that each of the one or more alignment blocks 28 may include a protective touch-proof feature (described in more detail with respect to FIGS. 8-11) to reduce the risk of electric shock, the protective touch-proof feature including a plurality of non-conductive ribs separated from each other to enable air flow through the respective alignment block. The pair of conductive strips 26L, 26R is arranged near a first edge (e.g., left edge) of the front-facing surface of the non-conductive vertical substrate 18, wherein one or more signal connectors 32 are arranged near a second edge (e.g., right edge) of the front-facing surface of the non-conductive vertical substrate 18. A respective signal connector 32 of the one or more signal connectors is configured for connection with corresponding signal connectors 30 of the respective circuit board 16. The non-conductive vertical substrate 18 may be one of a backplane or a midplane attached to the support structure of the shelf 12.

The shelf 12 may include a support structure including vertically-arranged posts and horizontally-arranged beams, only a portion of which is shown in FIG. 1. The support structure or frame of the shelf 12 may have a depth of about 600 mm or less according to some embodiments. Also, the support structure may include a pair of rear posts that define a rear plane. In some embodiments, the pair of conductive strips 26L, 26R are arranged in front of this rear plane.

Figure 3:
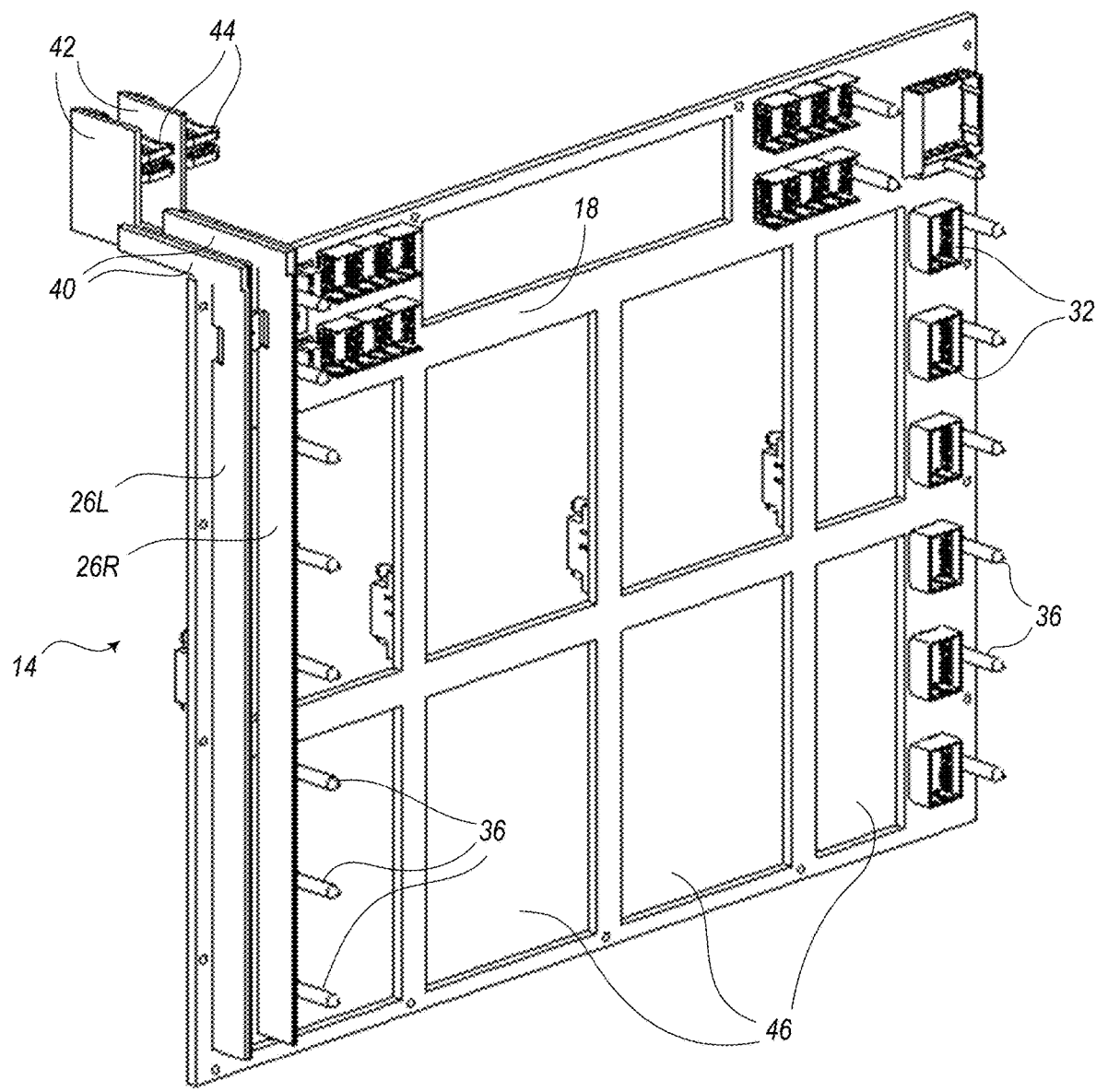
FIG. 3 is a diagram illustrating a front perspective view of the non-conductive substrate shown in FIG. 2, where parallel busbars are arranged perpendicular to the non-conductive substrate, according to various embodiments of the present disclosure.

FIG. 3 is a diagram illustrating a front perspective view of the non-conductive substrate 18 shown in FIG. 2. In this figure, the circuit board 16 and alignment blocks 28 are omitted to allow substantially the entire vertically-oriented non-conductive substrate 18 and the conductive strips 26 to be viewed. The conductive strips 26 include a left conductive strip 26L and a right conductive strip 26R. As shown, each of the conductive strips 26L, 26R is positioned in a sideways fashion, where a right-facing surface of the left conductive strip 26L faces and is substantially parallel with a left-facing surface of the right conductive strip 26R. The conductive strips 26L, 26R may be vertically-oriented conductive (e.g., copper) ribbon-shaped pieces that extend in a substantially perpendicular direction from the front face of the non-conductive substrate 18.

The busbars of the busbar assembly (e.g., busbar system 14) include the two conductive strips 26L, 26R and further include horizontally-oriented rearward extensions 40 that are electrically connected to the vertical conductive strips 26L, 26R and vertical plates 42 attached to a back end of the rearward extensions 40. The rearward extensions 40 are configured to rest on a top edge of the non-conductive substrate 18. Attached to the vertical plates 42 are a pair of power connectors 44 that may be connected to one or more of the power modules 24 shown in FIG. 1 or other power source.

The vertical non-conductive substrate 18 may be configured with one or more windows 46 to allow air flow through the system. The windows 46 may extend behind the busbars or conductive strips 26L, 26R as well to allow air to flow through the busbar system 14.

Figure 4:
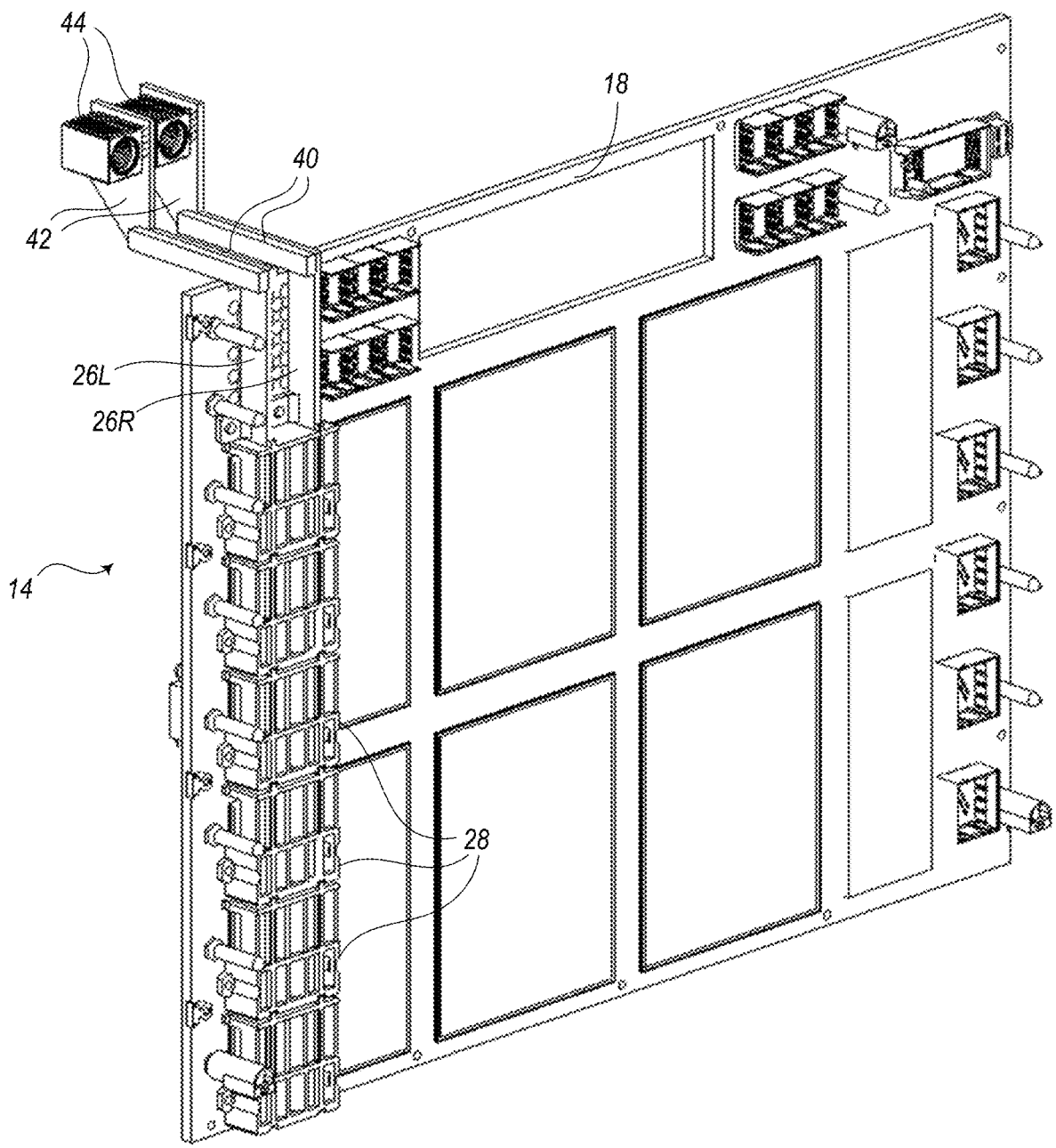
FIG. 4 is a diagram illustrating a front perspective view of the non-conductive substrate and busbars shown in FIG. 3, where alignment blocks are connected to the non-conductive substrate to cover portions of the parallel busbars, according to various embodiments of the present disclosure.
Figure 5:
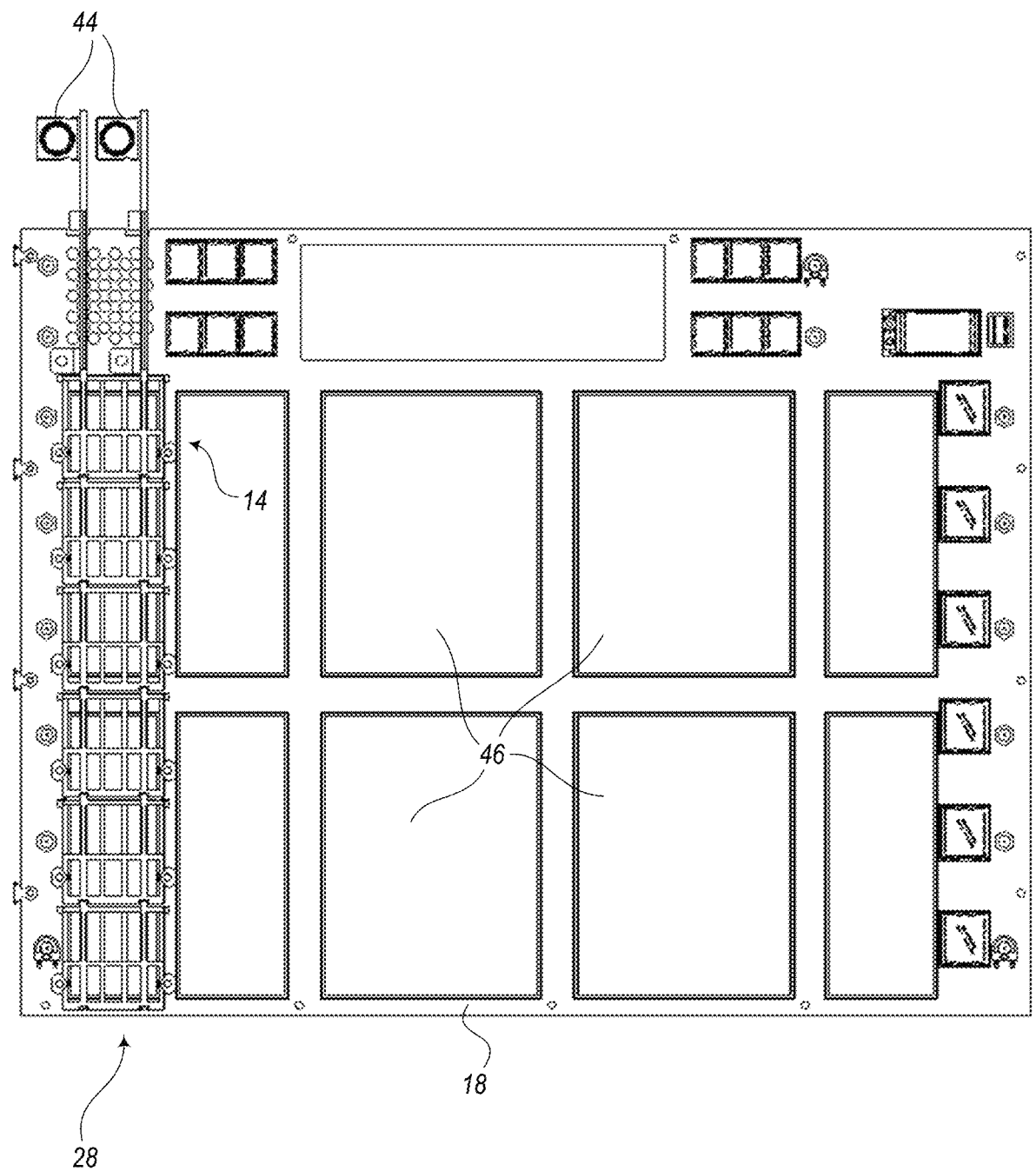
FIG. 5 is a diagram illustrating a front view of the non-conductive substrate and busbars shown in FIG. 3, where the alignment blocks shown in FIG. 4 are connected to the non-conductive substrate, according to various embodiments of the present disclosure.

FIG. 4 is a diagram illustrating a front perspective view of the non-conductive substrate 18 and busbars (i.e., conductive strips 26L, 26R) of the busbar system 14 shown in FIG. 3, where the alignment blocks 28 (or protective modules) are connected to the non-conductive substrate 18 to cover portions of the conductive strips 26L, 26R where a plurality of horizontally circuit boards may be installed. As shown in the embodiment of FIG. 4, there are six alignment blocks 28 configured to accommodate six horizontally oriented circuit boards (e.g., circuit board 16) in six horizontal slots in the shelf or chassis. FIG. 5 is a diagram illustrating a front view of the non-conductive substrate 18 and busbar assembly (or busbar system 14), where the alignment blocks 28 shown in FIG. 4 are connected to the non-conductive substrate 18.

Figure 6:
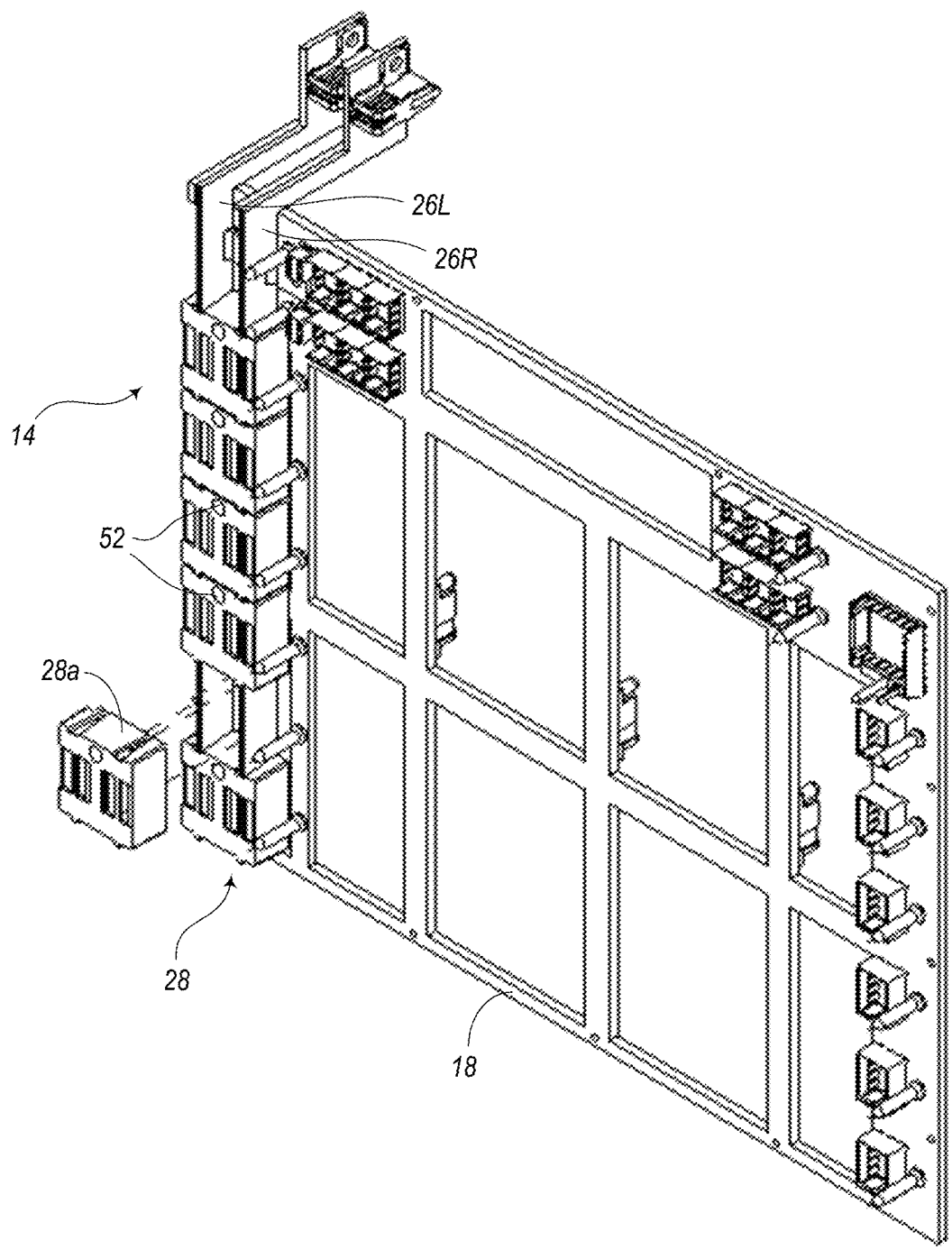
FIG. 6 is a diagram illustrating a front perspective view of the non-conductive substrate and busbars shown in FIG. 3, where one of the alignment blocks shown in FIG. 4 is being connected to the non-conductive substrate, according to various embodiments of the present disclosure.
Figure 7:
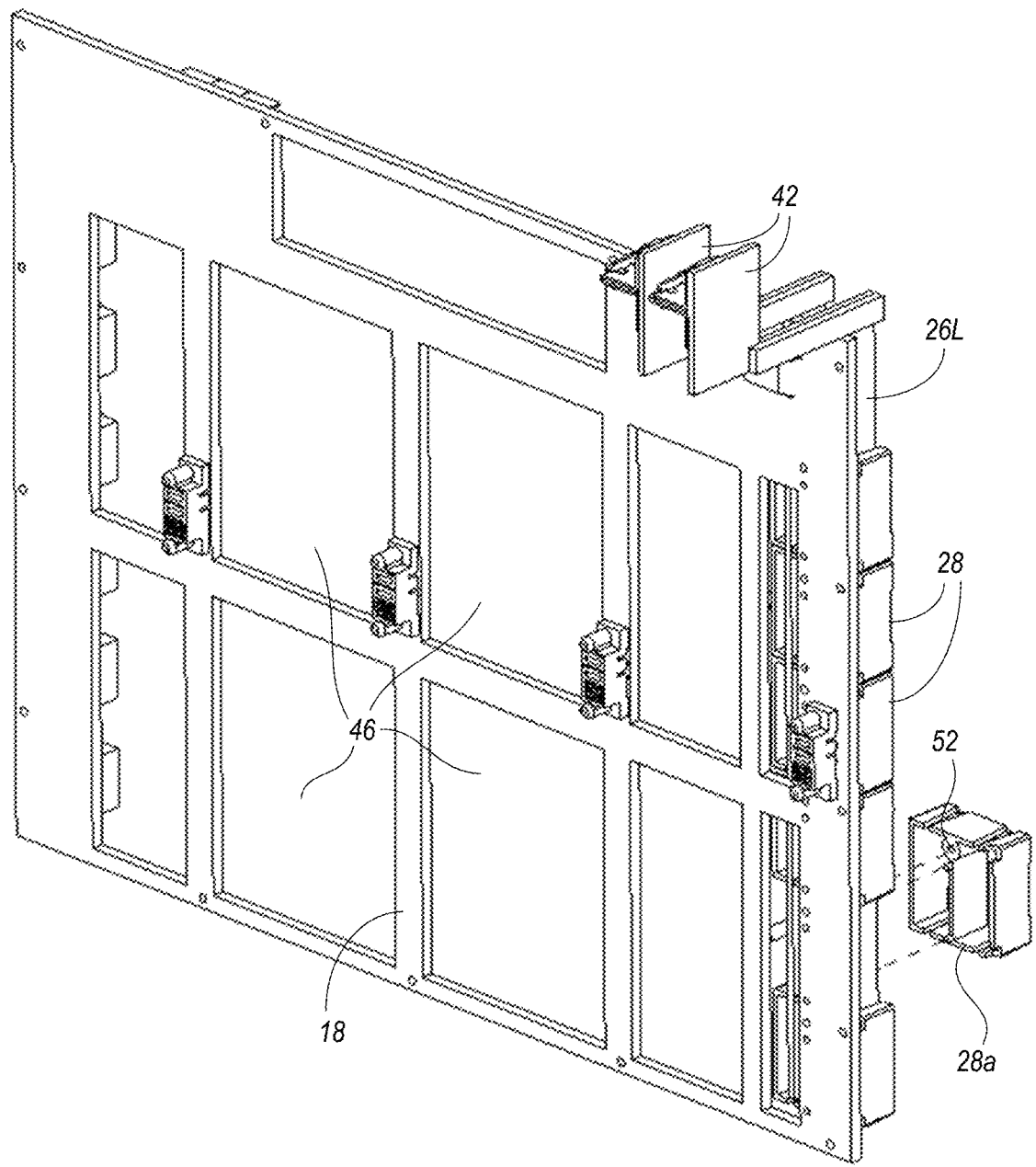
FIG. 7 is a diagram illustrating a back perspective view of the non-conductive substrate shown in FIGS. 2-6, where one of the alignment blocks shown in FIG. 4 is being connected to the non-conductive substrate, according to various embodiments of the present disclosure.

FIG. 6 is a diagram illustrating another front perspective view of the non-conductive substrate 18 shown in FIGS. 2-5 and the busbar system 14. FIG. 7 is a diagram illustrating a back perspective view of the non-conductive substrate 18. In FIGS. 6 and 7, all but one of the alignment blocks 28 are connected to the non-conductive substrate 18. A remaining alignment block 28a may be inserted over the remaining exposed portions of the vertical conductive strips 26L, 26R of the busbar system 14. Each of the alignment blocks 28, 28a may include an aperture 52 configured to receive a screw or other fastening device (not shown) for securely attaching the alignment block 28, 28a to the substrate 18.

To achieve a protective barrier, the alignment blocks 28 may comprise plastic, thermoplastic, elastomer, or other suitable non-conductive or insulative material and may be formed by any suitable manufacturing process (e.g., injection molding). The alignment block 28 may be configured with alignment features to align itself and the busbars on the non-conductive substrate 18 with precision and may be accurate within a tolerance of about 0.005 inches.

Figures 8, 9:
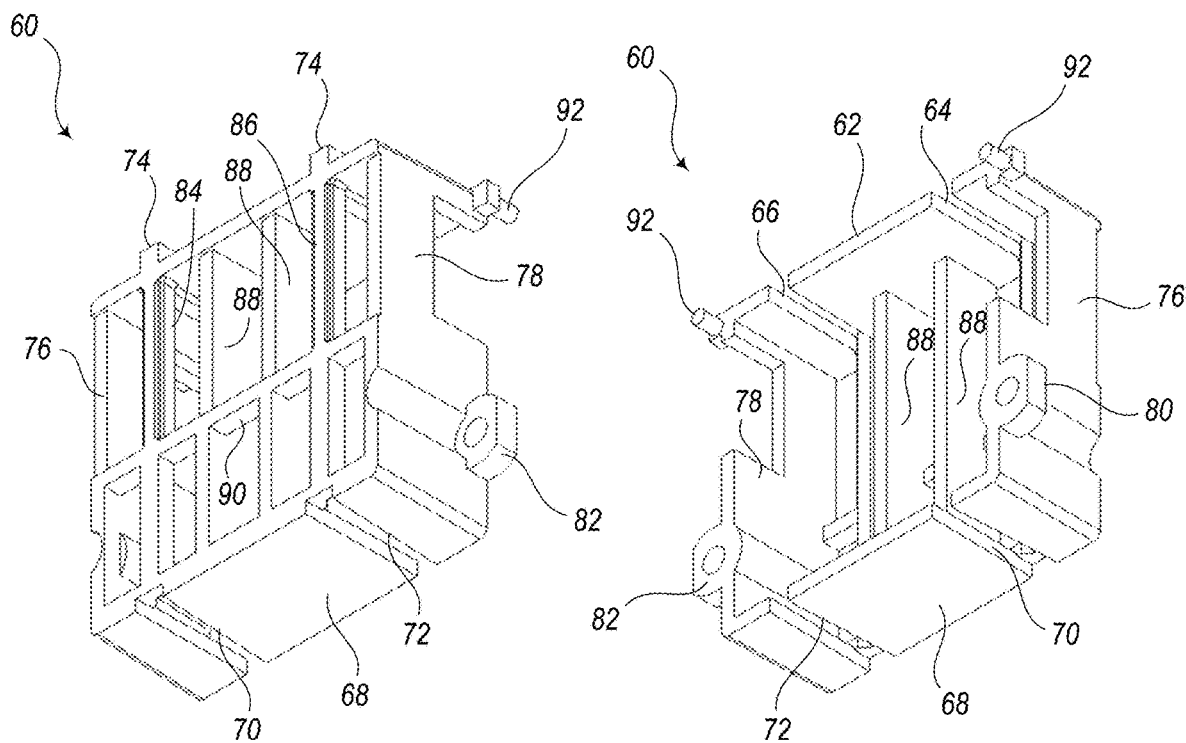
FIG. 8 is a diagram illustrating a front perspective view of one of the alignment blocks shown in FIGS. 4-7, according to various embodiments of the present disclosure.
FIG. 9 is a diagram illustrating a back perspective view of the alignment block of FIG. 8, according to various embodiments of the present disclosure.
Figures 10, 11:
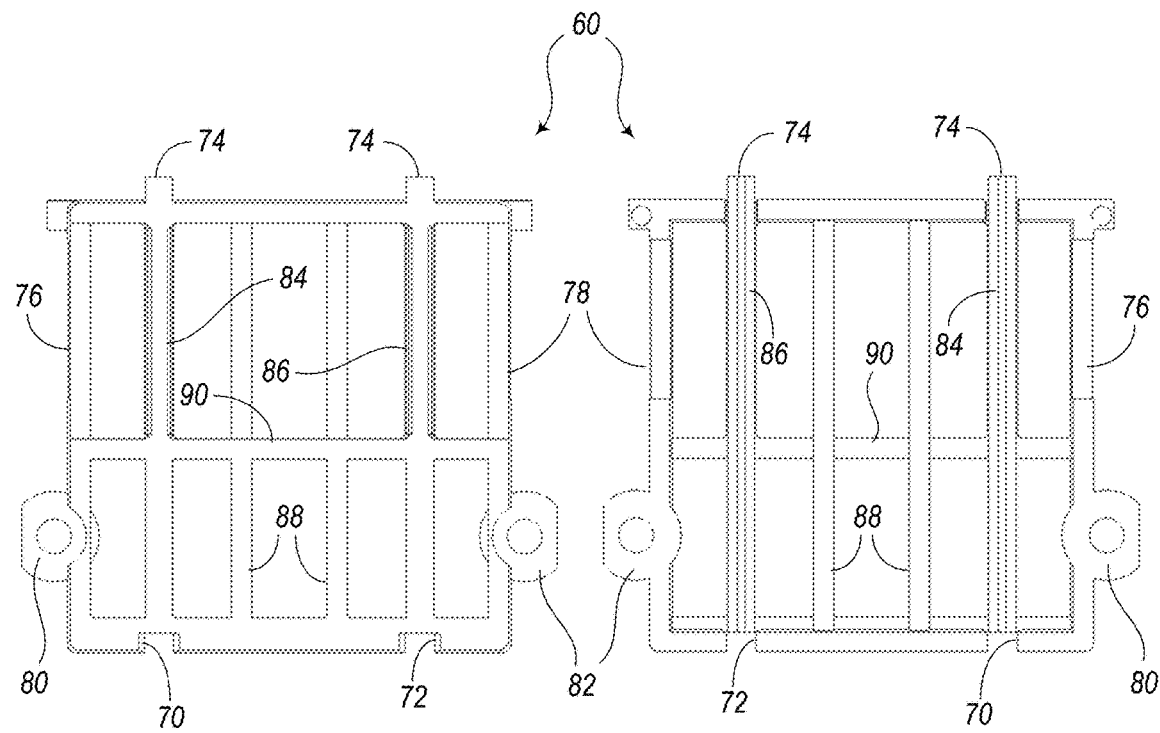
FIG. 10 is a diagram illustrating a front view of the alignment block of FIG. 8, according to various embodiments of the present disclosure.
FIG. 11 is a diagram illustrating a back view of the alignment block of FIG. 8, according to various embodiments of the present disclosure.

FIGS. 8-11 shows various views of a first embodiment of an alignment block 60, which may be representative of one of the alignment blocks 28, 28a shown in FIGS. 4-7. FIG. 8 is a front perspective view of the alignment block 60 and FIG. 9 is a back perspective view of the alignment block 60. FIG. 10 is a front view and FIG. 11 is back view of the alignment block 60.

The alignment block 60 may be configured to provide alignment for power connectors (e.g., power connectors 22) on a circuit board (e.g., circuit board 16) to guide electrical contacts of the power connectors through slots in the alignment block 60 to allow the electrical contacts to be electrically engaged with the conductive strips 26 for providing power to the circuit board. In addition to alignment functions, the alignment block 60 may be configured to provide protective functions for protecting users from electrical shock (or electrocution) from the electrical power being carried by the conductive strips 26 of the busbar system 14. Particularly, the alignment block 60 may include a touch-proof cage configuration that has spacing dimensions that would prevent a normal-sized human finger from contacting the conductive strips 26. While providing protection from electric shock, the touch-proof cage is also spaced to allow air to freely flow therethrough.

The alignment block 60 of FIGS. 8-11 includes a top cover 62 having a top left slit 64 and a top right slit 66. Also, the alignment block 60 includes a bottom cover 68 having a bottom left slit 70 and a bottom right slit 72. The bottom slits 70, 72 may be angled as shown or reverse drafted to keep the busbar aligned and straight. The top left slit 64 of the top cover 62 and the bottom left slit 70 of the bottom cover 68 form a channel in which the vertically-oriented left conductive strip 26L of the busbar system 14 is restrained. This channel (formed by top left slit 64 and bottom left slit 70) keeps the left conductive strip 26L from moving in a side-to-side direction. In addition, the top right slit 66 of the top cover 62 and the bottom right slit 72 of the bottom cover 68 form another channel in which the vertically-oriented right conductive strips 26R is restrained for keeping this conductive strip 26R from moving in a side-to-side direction. When connecting the alignment block 60 onto the non-conductive substrate 18, the alignment block 60 is arranged such that its left and right channels are aligned with the vertical conductive strips 26L, 26R, respectively, such that the vertical conductive strips 26L, 26R are guided into these channels.

The top cover 62 may also include one or more protrusions 74 that extend upward above the surface of the top cover 62. When multiple alignment blocks 60 are positioned one on top of another, as shown in FIGS. 1, 2, and 4-7, the protrusions 74 of a first alignment block 60 are configured to be inserted into corresponding bottom slits 70, 72 of a second alignment block 60 located directly above the first alignment block 60.

In the embodiment of FIGS. 8-11, the alignment block 60 includes a left cover 76 and a right cover 78. The left cover 76 includes a left fastening feature 80 and the right cover 78 includes a right fastening feature 82. The left and right fastening features 80, 82 may be configured with any suitable fastening elements and other additional elements to enable the alignment block 60 to be secured to the non-conductive substrate 18. For example, in some embodiments, the left and right fastening features 80, 82 may each include an aperture or the like for receiving a screw or other suitable fastener for fixedly connecting the alignment block 60 in place on the non-conductive substrate 18. It should be noted that the non-conductive substrate 18 may include corresponding features (e.g., apertures, screw holes, etc.) that are accurately positioned (e.g., within a tolerance of about 0.005 inches) to enable the alignment blocks 60 to accurately align the conductive strips 26L, 26R for electrical connection with the power connectors 22 of the respective circuit board 16.

The alignment blocks 60, according to the embodiment of FIGS. 8-11, further include a cage-like structure on a front portion thereof. This cage-like structure is configured to protect a user from receiving an electrical shock from the conductive strips 26L, 26R and is further configured to allow enough space for air to flow past the conductive strips 26L, 26R for cooling purposes. The cage-like structure of the alignment block 60 includes a left front rib 84 and a right front rib 86. The left front rib 84 is arranged on the alignment block 60 such that it will be positioned in front of the channel formed by the top left slit 64 and the bottom left slit 70 to cover a front edge of the left conductive strip 26L. The right front rib 86 is arranged on the alignment block 60 such that it will be positioned in front of the channel formed by the top right slit 66 and the bottom right slit 72 to cover a front edge of the right conductive strip 26R.

The cage-like structure may further include one or more vertical beams, whereby two vertical beams 88 are shown in the embodiment of FIGS. 8-11. Also, the cage-like structure may also include one or more horizontal beams, whereby one horizontal beam 90 is shown in the embodiment of FIGS. 8-11. The ribs 84, 86, vertical beams 88, and/or horizontal beams 90, in combination are separated from each to enable air to flow through the alignment block 60 while also protecting a user from shock.

Furthermore, the alignment block 60 may include one or more alignment pins 92 positioned at a back portion of the alignment block 60. Corresponding apertures may be formed in the non-conductive substrate 18 for receiving the alignment pins 92. The alignment pins 92 and corresponding apertures are accurately positioned on their respective components (e.g., within a tolerance of about 0.005 inches) to allow the alignment blocks 60 to be accurately positioned on the non-conductive substrate 18. Thus, the alignment pins 92 plus the fastening features 80, 82 can be used to precisely position the alignment blocks 60.

Thus, the alignment blocks 60 may include features to guide front edges of the conductive strips 26L, 26R into protective channels where the front ribs 84, 86 are configured to cover these front edges to keep the conductive strips 26L, 26R from being touched by a user. The alignment pins 92 are configured to be press fit into the non-conductive substrate 18 for alignment of the alignment blocks 60 and conductive strips 26L, 26R with respect to the non-conductive substrate 18. Also, the protrusions 74 from a lower alignment block 60 engage the bottom slits 70, 72 of an upper alignment block 60 for alignment and protective purposes.

The alignment blocks 60 may have a height that is sized for the pitch of the circuit boards or circuit packs for which power connectors are guided. For example, a circuit pack may be configured to include any suitable pitch, measured in Rack Units (Rus). The alignment blocks 60 may include any height to correspond to the particular pitch of the respective circuit pack, which may be 1RU, 2RU, 4RU, etc. With a series of alignment blocks 60 mated and fastened to the non-conductive substrate 18 over the conductive strips 26, the structure of the busbar system 14 may have a similar appearance to a traditional backplane/midplane connector, yet it will draw power from common conductive strips 26L, 26R.

The non-conductive, insulating alignment block 28 has molded-in alignment pins 92 to press into matching holes in the non-conductive substrate (e.g., midplane). Tolerance is maintained from busbars to signal connectors by mating them both to a continuous non-conductive substrate with holes to maintain tolerance from each other. Hole to hole tolerance in a circuit board this size is typically 0.005". With the combination of tight tolerance plastic alignment blocks and the mounting of all alignment blocks, busbars and signal connectors to a single-piece midplane, there is very little variation in distance from the busbars to the signal connectors, allowing risk free blind mating of a circuit board guided on rails in a shelf to a midplane mounted to the same housing.

Figure 12:
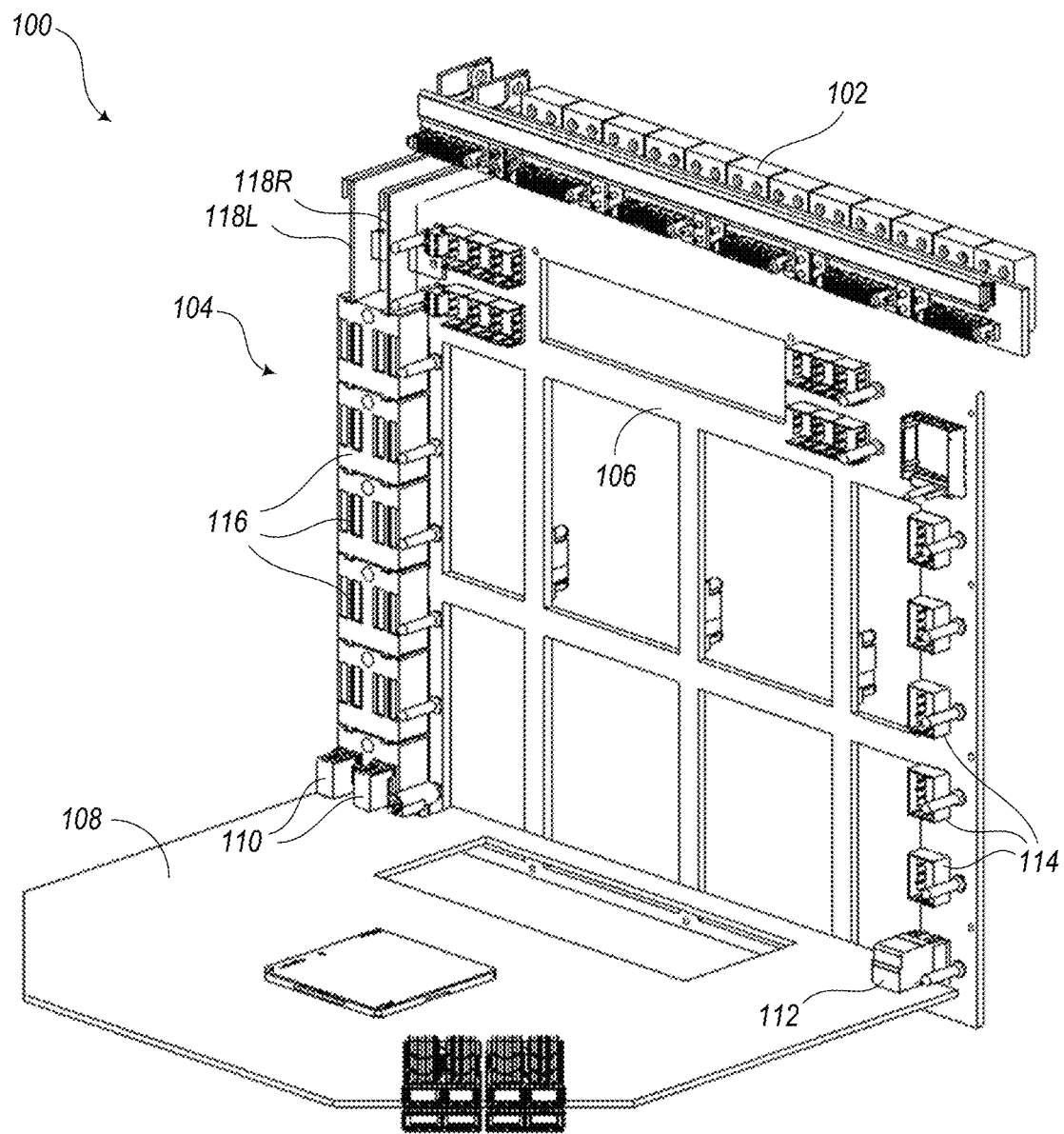
FIG. 12 is a diagram illustrating a front perspective view of networking equipment including a power source, a busbar assembly installed on a non-conductive substrate, and a circuit board connected to the non-conductive substrate for receiving power from the power source via the busbar assembly, where the busbar assembly includes a second type of alignment blocks for covering portions of parallel conductive busbars of the busbar assembly, according to various embodiments of the present disclosure.

FIG. 12 is a front perspective view showing another embodiment of networking equipment 100. In this embodiment, the networking equipment 100 includes a power box 102 configured to receive electrical power from a power source, such as the power modules 24 shown in FIG. 1. The power box 102 may be configured to provide electric power to a busbar assembly 104 that may include many similarities to the embodiments of busbar systems described above with respect to FIGS. 1-11. The busbar assembly 104 may be installed on a non-conductive substrate 106. The networking equipment 100 may be configured to include up to six circuit boards at six horizontal slots, where only one horizontally-oriented circuit board 108 is shown in FIG. 12. The circuit board 108 includes power connectors 110 for connection with the busbar assembly 104 and one or more signal connectors 112 for connection with corresponding signal connectors 114 on the non-conductive substrate 106. The circuit board 108 receives power from the power source via the busbar assembly 104. One of the differences between the busbar assembly 104 shown in FIG. 12 and previously described embodiments of the present disclosure is that the busbar assembly 104 may include a second type of alignment blocks 116 for covering portions of the vertically-oriented conductive busbars or conductive strips 118L, 118R of the busbar assembly 104.

The alignment blocks 116 may be configured to provide alignment for the power connectors 110 of the circuit board 108 to guide electrical contacts of the power connectors 110 through slots in the alignment block 116 to allow electrical contact with the conductive strips 118L, 118R of the busbar assembly 104, which enables the circuit board 108 to receive power from the power box 102 via the busbar assembly 104. In addition to alignment functions, the alignment block 116 may be configured to provide protective functions for protecting users from electrical shock (or electrocution) from the electrical power being carried by the conductive strips 118L, 118R of the busbar assembly 104. Particularly, the alignment block 116 may include a touch-proof cage configuration that has spacing dimensions that would prevent a normal-sized human finger from contacting the conductive strips 118L, 118R.

Figure 13:
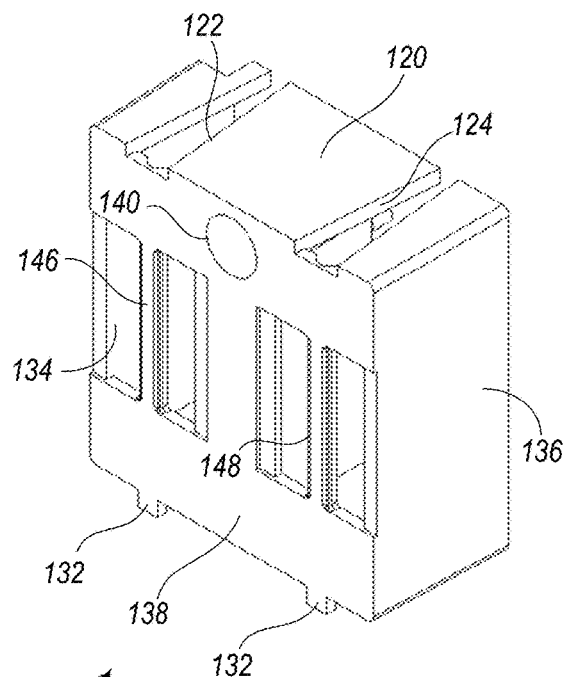
FIG. 13 is a diagram illustrating a front perspective view of the second type of alignment block shown in FIG. 12, according to various embodiments of the present disclosure.
Figure 14:
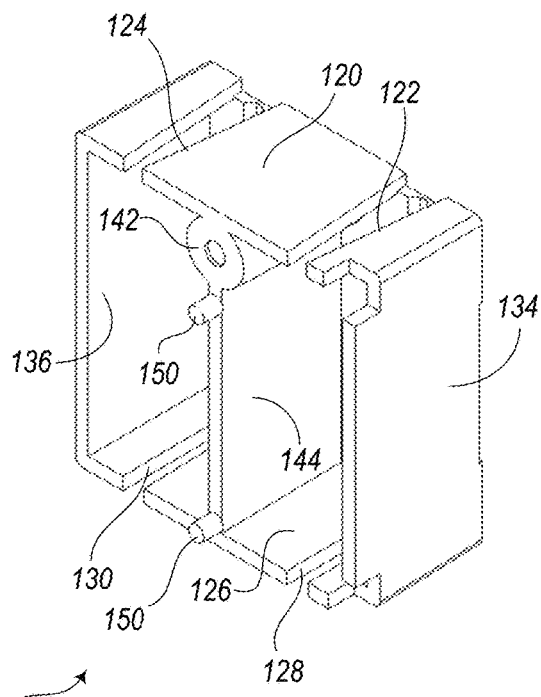
FIG. 14 is a diagram illustrating a back perspective view of the second type of alignment block of FIG. 13, according to various embodiments of the present disclosure.
Figure 15:
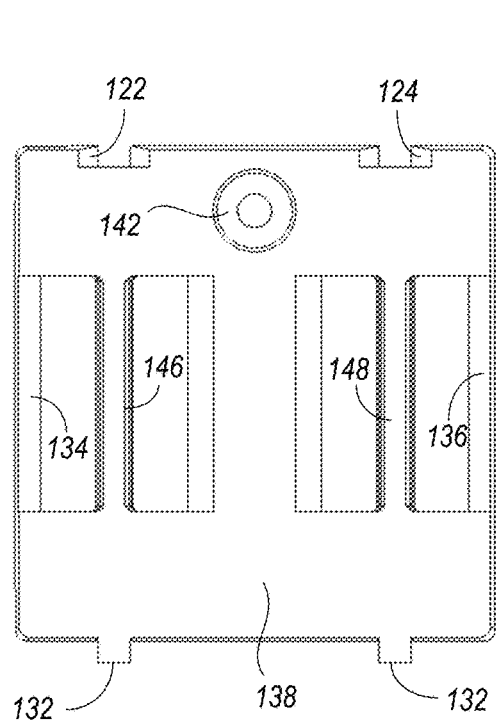
FIG. 15 is a diagram illustrating a front view of the second type of alignment block of FIG. 13, according to various embodiments of the present disclosure.
Figure 16:
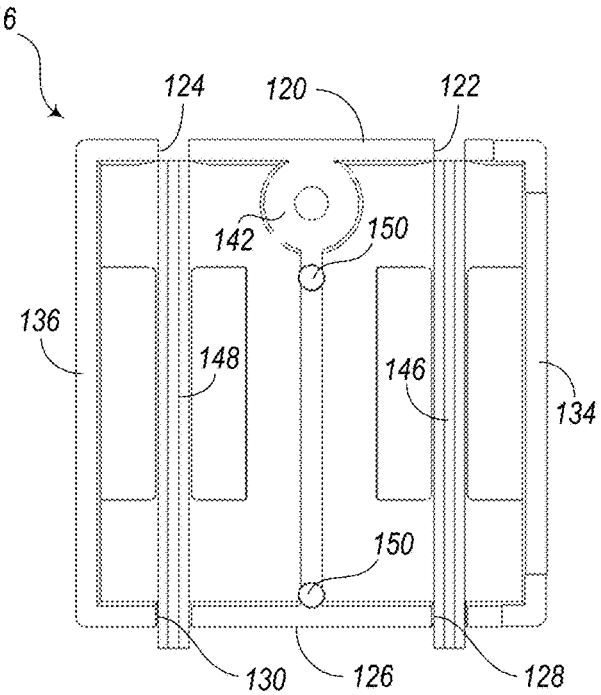
FIG. 16 is a diagram illustrating a back view of the second type of alignment block of FIG. 13, according to various embodiments of the present disclosure.
Figure 17:
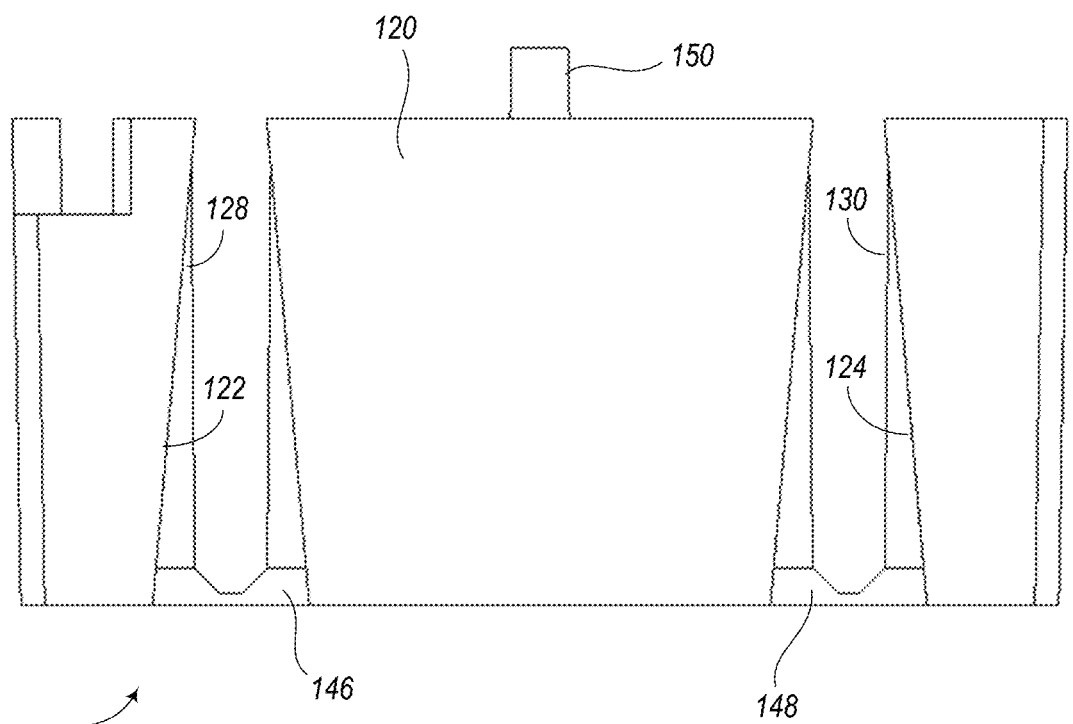
FIG. 17 is a diagram illustrating a top view of the second type of alignment block of FIG. 13, according to various embodiments of the present disclosure.
Figure 18:
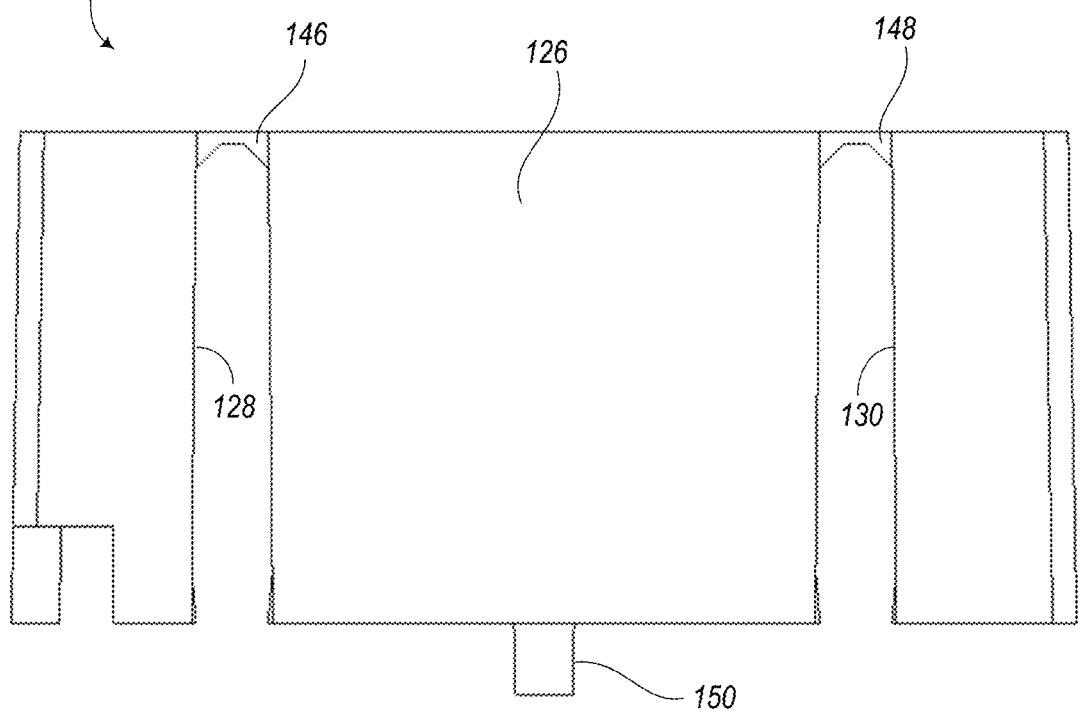
FIG. 18 is a diagram illustrating a bottom view of the second type of alignment block of FIG. 13, according to various embodiments of the present disclosure.

FIGS. 13-18 illustrate various views of the alignment block 116 shown in FIG. 12. For example, FIG. 13 is a front perspective view of an embodiment of this second type of alignment block 116. FIG. 14 is a back perspective view of the alignment block 116. The alignment block 116 is also illustrated by the front view of FIG. 15, the back view of FIG. 16, the top view of FIG. 17, and the bottom view of FIG. 18.

The alignment block 116 of FIGS. 13-18 includes a top cover 120 having a top left slit 122 and a top right slit 124. The top slits 122, 124 may be angled as shown or reverse drafted to keep the busbar aligned and straight. Also, the alignment block 116 includes a bottom cover 126 having a bottom left slit 128 and a bottom right slit 130. The top left slit 122 of the top cover 120 and the bottom left slit 128 of the bottom cover 126 form a channel in which the left vertical conductive strip 118L of the busbar assembly 104 is restrained. This channel (formed by top left slit 122 and bottom left slit 128) keeps the left conductive strip 118L from moving in a side-to-side direction. In addition, the top right slit 124 of the top cover 120 and the bottom right slit 130 of the bottom cover 126 form another channel in which the right conductive strip 118R is restrained for keeping this conductive strip 118R from moving in a side-to-side direction. When connecting the alignment block 116 onto the non-conductive substrate 106, the alignment block 116 is arranged such that its left and right channels are aligned with the vertical conductive strips 118L, 118R, respectively, such that the vertical conductive strips 118L, 118R are guided into these channels.

In the embodiment of FIGS. 13-18, the alignment block 116 includes a left cover 134, a right cover 136, and a front cover 138. The front cover 138 may include one or more protrusions 132 that extend downward below the surface of the bottom cover 126. When multiple alignment blocks 116 are positioned one on top of another, as shown in FIG. 12, the protrusions 132 of a first alignment block 116 are configured to be inserted into corresponding top slits 122, 124 of a second alignment block 116 located directly below the first alignment block 116.

The front cover 138 includes an aperture 140 that allows access to a fastening feature 142 integrated into a center beam 144 that connects the top cover 120 to the bottom cover 126. The fastening feature 142 may be configured with any suitable fastening elements and other additional elements to enable the alignment block 116 to be secured to the non-conductive substrate 106. For example, in some embodiments, the fastening feature 142 may include an aperture or the like for receiving a screw or other suitable fastener for fixedly connecting the alignment block 116 in place on the non-conductive substrate 106. It should be noted that the non-conductive substrate 106 may include corresponding features (e.g., apertures, screw holes, etc.) that are accurately positioned (e.g., within a tolerance of about 0.005 inches) to enable the alignment blocks 116 to accurately align the conductive strips 118L, 118R for electrical connection with the power connectors 110 of the respective circuit board 108.

According to the embodiment of FIGS. 13-18, the front cover 138 of the alignment blocks 116 may be configured with a different type of structure than the cage-like structure shown on the front portion of the alignment block 60 of FIGS. 8-11. Like the alignment block 60, the alignment block 116 is configured to both protect a user from receiving an electrical shock from conductive busbars and to also allow enough space for air to flow through the alignment block to cool the busbars. The front cover 138 of the alignment block 116 includes a left front rib 146 and a right front rib 148. The left front rib 146 is arranged on the alignment block 116 such that it will be positioned in front of the channel formed by the top left slit 122 and the bottom left slit 128 to cover a front edge of the left conductive strip 118L. The right front rib 148 is arranged on the alignment block 116 such that is will be positioned in front of the channel formed by the top right slit 124 and the bottom right slit 130 to cover a front edge of the right conductive strip 118R.

Furthermore, the alignment block 116 may include one or more alignment pins 150 positioned at a back portion of the alignment block 116. In this embodiment the alignment pins 150 may extend rearward from the center beam 144. Corresponding apertures may be formed in the non-conductive substrate 106 for receiving the alignment pins 150. The alignment pins 150 and corresponding apertures are accurately positioned on their respective components (e.g., within a tolerance of about 0.005 inches) to allow the alignment blocks 116 to be accurately positioned on the non-conductive substrate 106. Thus, the alignment pins 150 plus the fastening feature 142 can be used to precisely position the alignment blocks 116.

The alignment blocks 116 may include features to guide front edges of the conductive strips 118L, 118R into protection channels, whereby the front ribs 146, 148 are configured to cover these front edges to keep the conductive strips 118L, 118R from being touched by a user. The ribs 146, 148 and other protective features of the front cover 138 of the alignment block 116 are separated from each other to enable air flow while also providing protection to the user. The downwardly-extending protrusions 132 from a top-positioned alignment block 116 are configured to press fit onto a bottom-positioned alignment block 116. Also, during installation, the alignment pins 150 of each alignment block 116 are configured to engage with corresponding apertures in the non-conductive substrate 106 for alignment of the alignment blocks 116 and protected conductive strips 118L, 118R to the non-conductive substrate 106.

Again, the alignment blocks 116 may have a height that is sized for the pitch of the circuit packs for which power connectors are guided. The alignment blocks 116 may include any height to correspond to the particular pitch of the respective circuit pack, which may be 1RU, 2RU, 4RU, etc. With a series of alignment blocks 116 mated and fastened to the non-conductive substrate 106 over the conductive strips 118, the structure of the busbar assembly 104 may have a similar appearance to a traditional backplane/midplane connector, yet it will draw power from common conductive strips 118L, 118R.

The alignment block 116 has molded-in alignment pins 150 to press into matching holes in the non-conductive substrate 106. Tolerance is maintained from busbars (e.g., conductive strips 118L, 118R) to signal connectors 114 by mating them both to a continuous non-conductive substrate 106 with holes to maintain tolerance from each other. Hole-to-hole tolerance in a circuit board 108 in this embodiment may be about 0.005". With the combination of tight tolerance of the alignment blocks 116, their mounting features, conductive strips 118, and signal connectors 114 with a single-piece non-conductive substrate 106, there is very little variation in distance from the busbars or conductive strips 118 to the signal connectors 114, allowing risk-free blind mating of a circuit board 108 guided on rails (e.g., support rails 20 shown in FIG. 1) in a shelf 12 to a non-conductive substrate 106 mounted to the same housing or shelf.

Figure 19:
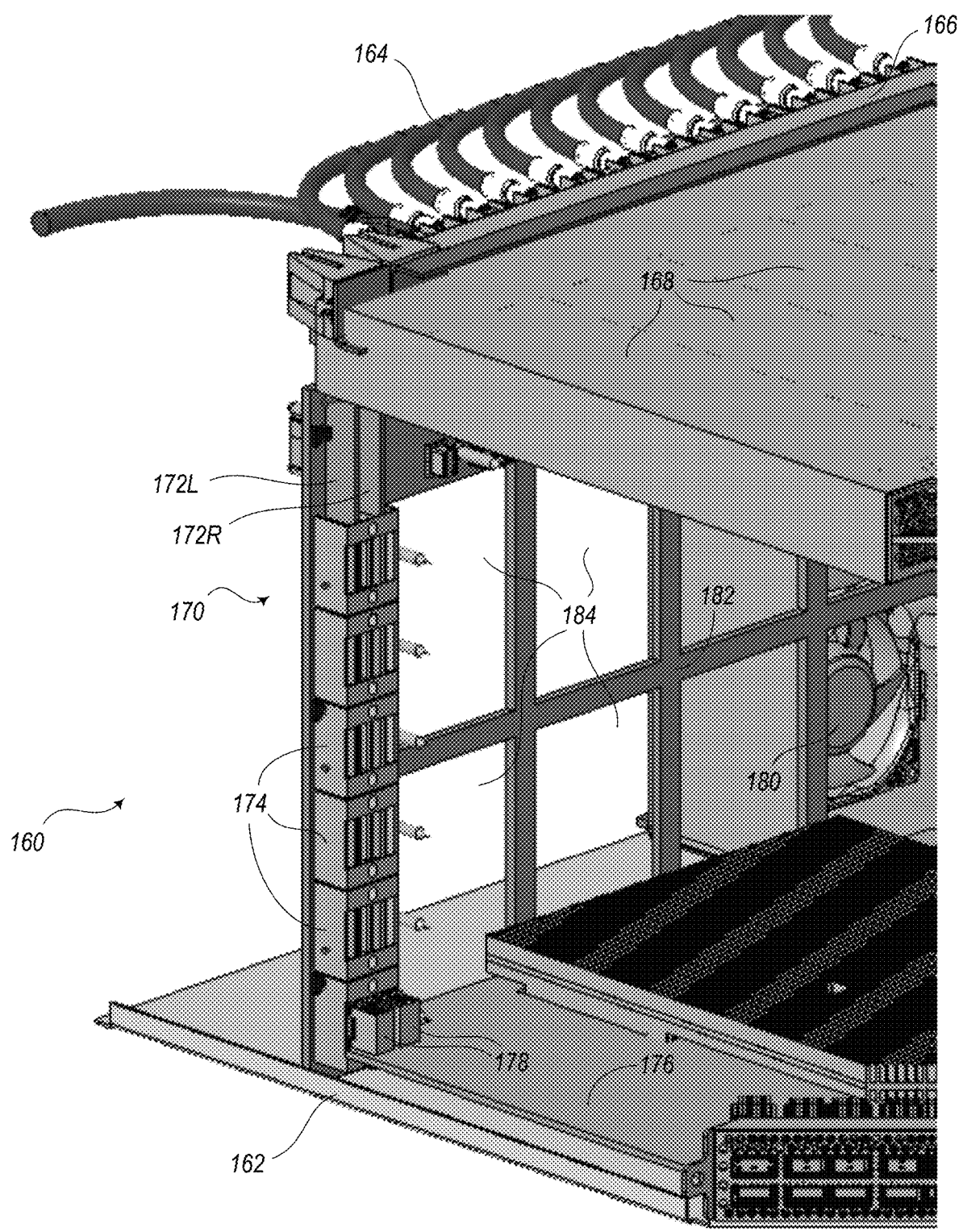
FIG. 19 is a diagram illustrating a front perspective view of networking equipment including a power source, a busbar assembly installed on a non-conductive substrate, and a circuit board connected to the non-conductive substrate for receiving power from the power source via the busbar assembly, where the busbar assembly includes a third type of alignment blocks for covering portions of parallel conductive busbars of the busbar assembly, according to various embodiments of the present disclosure.

FIG. 19 is a front perspective view showing another embodiment of networking equipment 160 mounted in a portion of a shelf 162. A power source is connected via cables 164 to a power box 166, which in turn is connected to power modules 168. Electrical power may then be supplied to a busbar assembly 170 that includes vertically-oriented conductive strips 172L, 172R and a plurality of alignment blocks 174. As shown in FIG. 19, a circuit board 176 includes power connectors 178 that are configured to be inserted through a respective alignment block 174 to make contact with the conductive strips 172L, 172R to provide power to the circuit board 176. In this embodiment, a fan 180 is shown for moving air through the networking equipment 160 to remove heat and keep the networking equipment 160 from overheating. The conductive strips 172 and alignment blocks 174 are supported on a front face of a non-conductive substrate 182 having one or more windows 184 to enable air blown by the fan 180 to flow through the networking equipment 160 for cooling. One or more additional fans may be positioned behind the busbar assembly 170 for causing air to flow through the busbar assembly 170 to prevent overheating thereof.

Figures 20, 21:
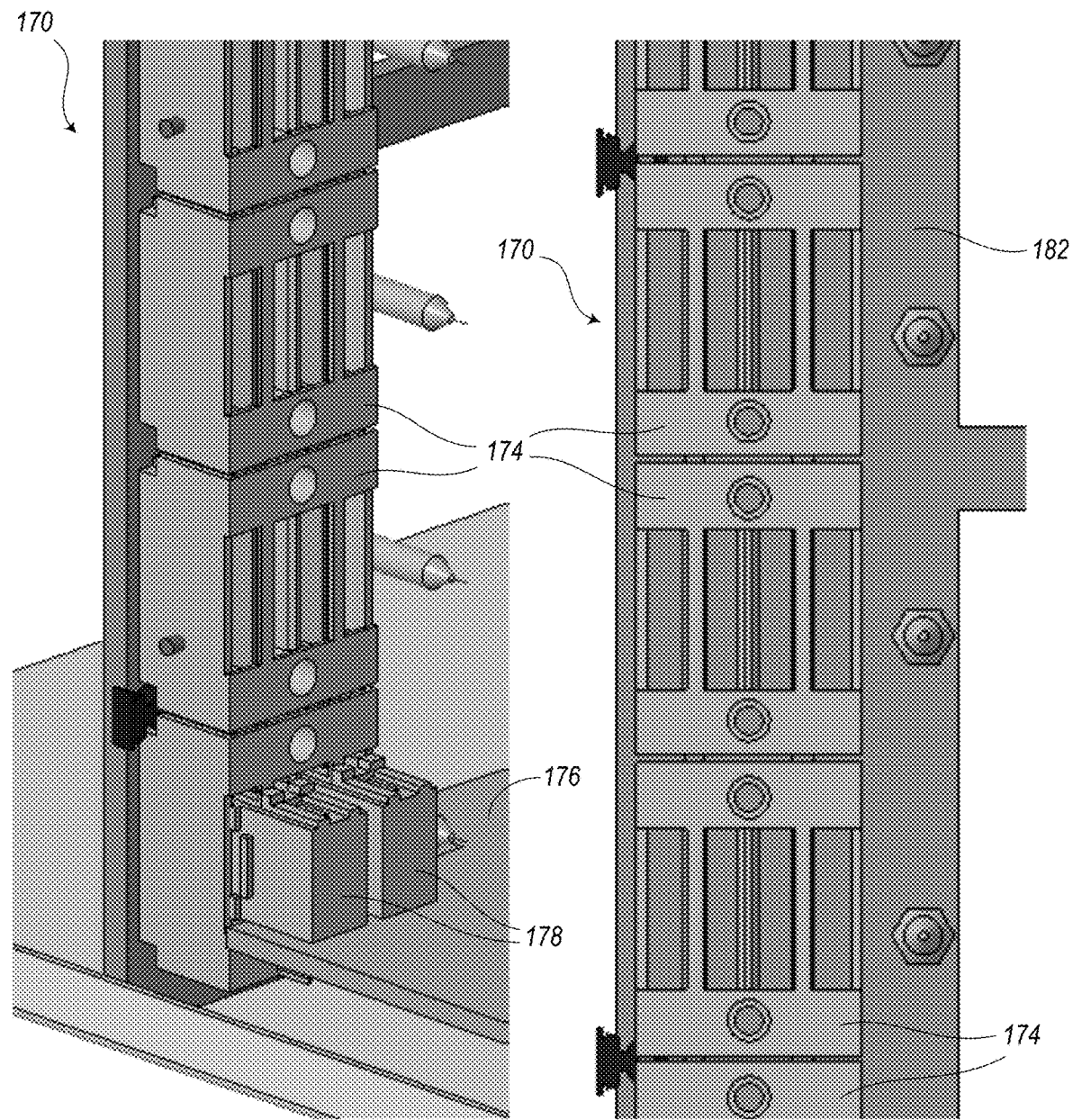
FIG. 20 is a diagram illustrating a close-up front perspective view of the third type of alignment blocks shown in FIG. 19, where the circuit board is connected to one of the alignment blocks, according to various embodiments of the present disclosure.
FIG. 21 is a diagram illustrating a front view of the third type of alignment blocks shown in FIG. 19, according to various embodiments of the present disclosure.

FIG. 20 is a close-up front perspective view of the third busbar assembly 170 shown in FIG. 19 to show details of the alignment blocks 174 according to a third embodiment. Again, the power connectors 178 of the circuit board 176 are shown as being fully installed in order to connect to the busbars (e.g., conductive strips 172L, 172R). Electrical contact is made through one of the alignment blocks 174 when the circuit board 176 is fully inserted onto the non-conductive substrate 182 for power and signal connection. FIG. 21 shows a front view of the alignment blocks 174 of the busbar assembly 170 shown in FIG. 19 accurately attached to the non-conductive substrate 182.

Figure 22:
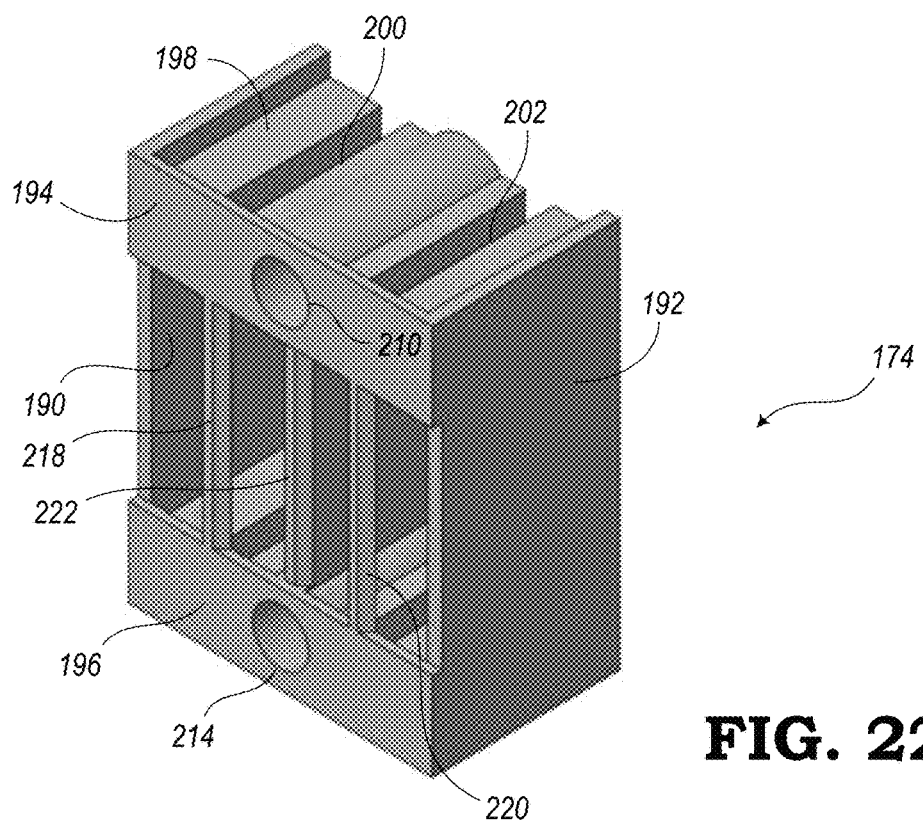
FIG. 22 is a diagram illustrating a front perspective view of the third type of alignment blocks shown in FIG. 19, according to various embodiments of the present disclosure.
Figure 23:
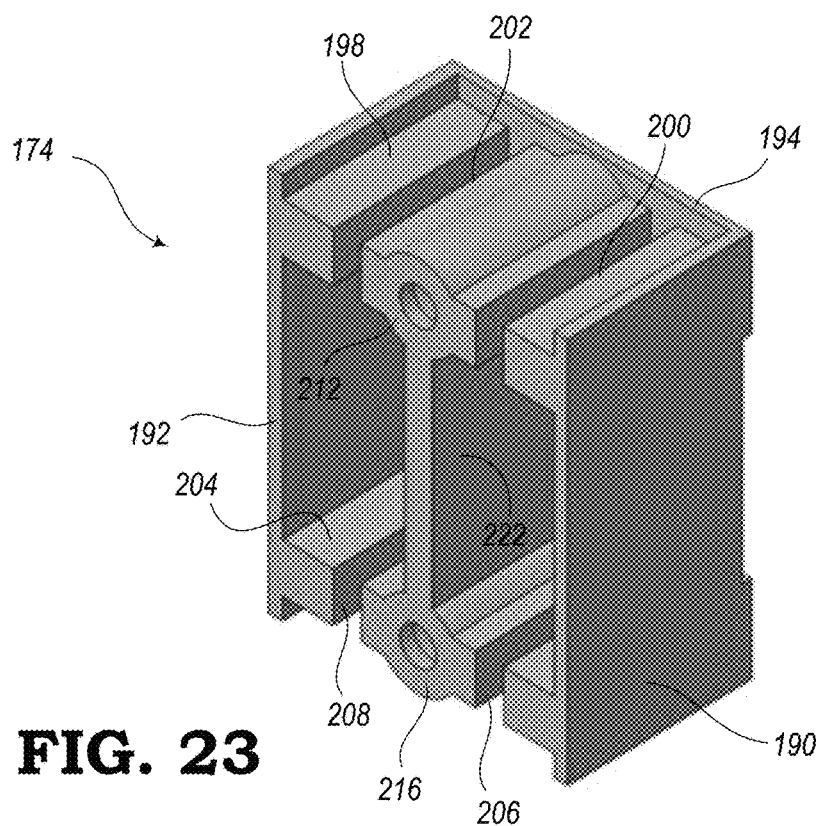
FIG. 23 is a diagram illustrating a back perspective view of the third type of alignment block of FIG. 22, according to various embodiments of the present disclosure.

FIG. 22 is a front perspective view of one of the alignment blocks 174 shown in FIG. 19 and FIG. 23 is a back perspective view of the alignment block 174. As mentioned above, the alignment block 174 may be configured to provide alignment for power connectors 178 on a circuit board 176 to guide electrical contacts of the power connectors 178 through slots in the alignment block 174 to allow the electrical contacts to be electrically engaged with the conductive strips 172L, 172R shown in FIG. 19 for providing power to the circuit board 176. In addition to alignment functions, the alignment block 174 may be configured to provide protective functions for protecting users from electrical shock from the electrical power being carried by the conductive strips 172L, 172R of the busbar assembly 170. Particularly, the alignment block 174 may include a touch-proof cage configuration that has spacing dimensions that would prevent a normal-sized human finger from contacting the conductive strips 172L, 172R.

The alignment block 174 of FIGS. 20-23 includes a left side cover 190 and a right side cover 192. A top front panel 194 extends along a top portion of a front face of the alignment block 174 from the left side cover 190 to the right side cover 192. Also, a bottom front panel 196 extends along a bottom portion of the front face of the alignment block 174 from the left side cover 190 to the right side cover 192.

Also, a top horizontal beam 198 extends from a top portion of the left side cover 190 to a top portion of the right side cover 192. The top horizontal beam 198 includes a top left slit 200 and a top right slit 202. A bottom horizontal beam 204 extends from a bottom portion of the left side cover 190 to a bottom portion of the right side cover 192. The bottom horizontal beam 204 includes a bottom left slit 206 and a bottom right slit 208. The top left slit 200 and the bottom left slit 206 form a left channel configured to accommodate the left conductive strip 172L. The top right slit 202 and the bottom right slit 208 form a right channel configured to accommodate the right conductive strip 172R. The channels (formed by the pairs of slits 200/206 and 202/208) keep the conductive strips 172L, 172R, respectively, from moving in a side-to-side direction.

In the embodiment of FIGS. 20-23, the alignment block 174 may include a top aperture 210 that allows access to a top fastening feature 212 integrated into the top horizontal beam 198. Also, a bottom aperture 214 allows access to a bottom fastening feature 216 integrated into the bottom horizontal beam 204. The top and bottom fastening features 212, 216 may be configured with any suitable fastening elements and other additional elements to enable the alignment block 174 to be secured to the non-conductive substrate 182. For example, in some embodiments, the top and bottom fastening features 212, 216 may each include an aperture or the like for receiving a screw or other suitable fastener for fixedly connecting the alignment block 174 in place on the non-conductive substrate 182. It should be noted that the non-conductive substrate 182 may include corresponding features (e.g., apertures, screw holes, etc.) that are accurately positioned (e.g., within a tolerance of about 0.005 inches) to enable the alignment blocks 174 to be accurately aligned with the conductive strips 172L, 172R for electrical connection with the power connectors 178 of the respective circuit board 176.

The alignment blocks 174, according to the embodiment of FIGS. 20-23, further include a cage-like structure on a front portion thereof. This cage-like structure is configured to protect a user from receiving an electrical shock from the conductive strips 172L, 172R while also allowing enough space for air to flow past the conductive strips 172L, 172R for cooling purposes. The cage-like structure of the alignment block 174 may include a left front rib 218 and a right front rib 220. The left front rib 218 is arranged on the alignment block 174 such that it will be positioned in front of the channel formed by the top left slit 200 and the bottom left slit 206 to cover a front edge of the left conductive strip 172L. The right front rib 220 is arranged on the alignment block 174 such that is will be positioned in front of the channel formed by the top right slit 202 and the bottom right slit 208 to cover a front edge of the right conductive strip 172R. The cage-like structure may further include one or more vertical beams 222, whereby a single center-positioned vertical beam 222 is shown in this embodiment, which may further be connected to the fastening features 212, 216.

Figure 24:
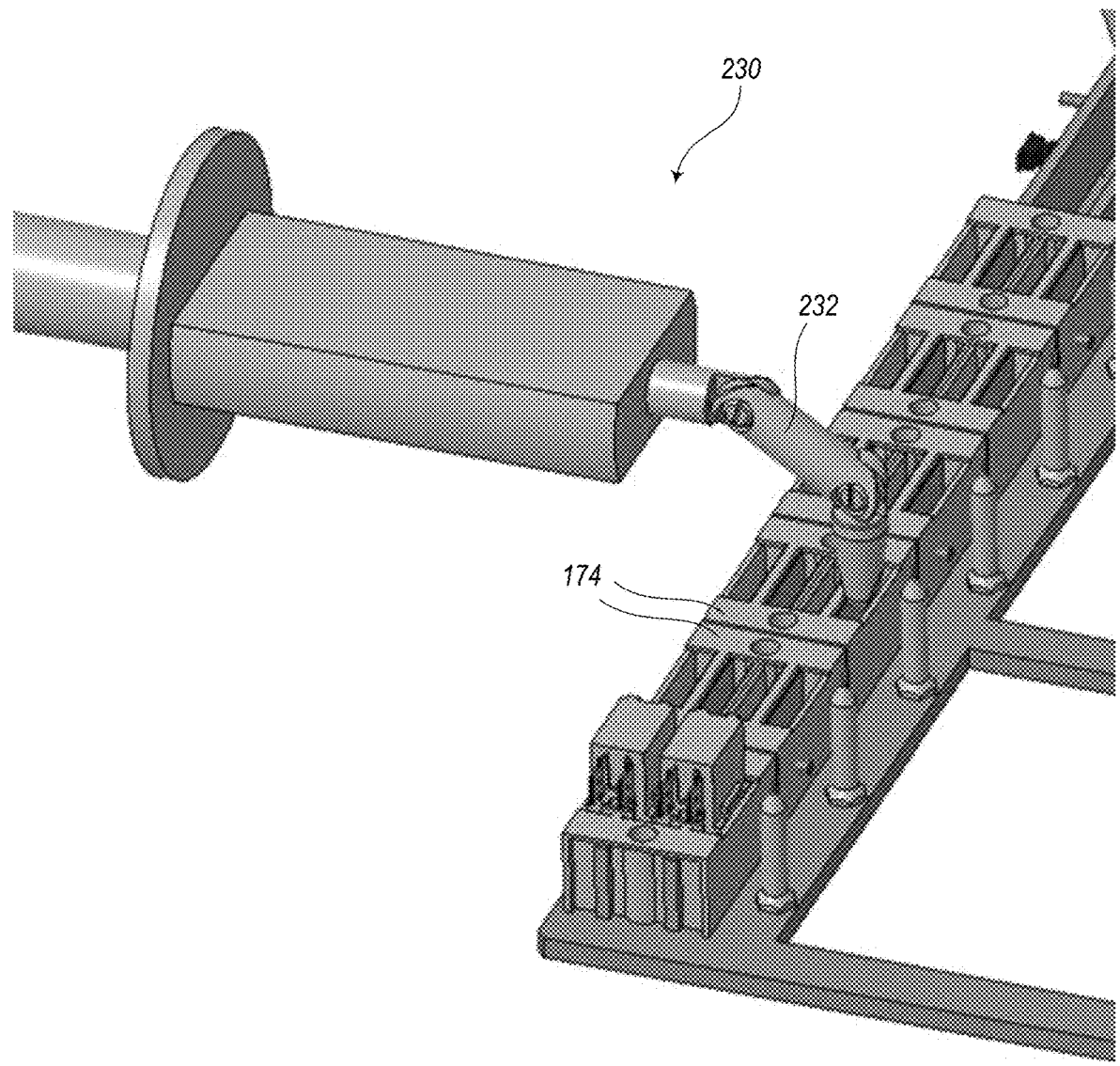
FIG. 24 is a diagram illustrating a perspective view of a test fixture for testing a risk of electric shock or electrocution based on a spacing of ribs of the third type of alignment block of FIG. 22, according to various embodiments of the present disclosure.

FIG. 24 is a perspective view illustrating an example of a test fixture 230 for testing a risk of electric shock or electrocution to a user. The risk of shock may be based on various volumetric spaces of electrical equipment (e.g., busbar assemblies) where a human finger may inadvertently be inserted. To reduce the risk of shock, the embodiments described herein include front ribs and/or other features built into the alignment blocks (or protective modules) for blocking the user from a frontal access to the vertically-oriented conductive busbar strips as described in the present disclosure. In the embodiment of FIG. 24, the test fixture 230 is being used to test the third type of alignment block 174 of FIGS. 22 and 23, although it should be noted that any alignment blocks may be tested by this test fixture 230.

The test fixture 230 may be used for safety purposes to determine if a user can stick their finger in a space between the various front features (e.g., side covers 190, 192, ribs 218, 220, vertical beam 222-0, etc.), which may cause electric shock (or electrocution) if the user's finger comes in contacts with the conductive strips 172L, 172R when they are powered. The test fixture 230 includes an articulated finger 232, which may include similarities to the shape and movement of an average human finger. Since there may be 48 volts on each of the conductive strips 172L, 172R, it is usually key to perform such tests to make sure a user will not be at risk. The various embodiments of the present disclosure have been tested using a device similar to the test fixture 230 to determine that the alignment blocks 28, 60, 116, 174 pass the test for reducing the risk of electrical shock and may be considered to be touch-proof and essentially free of the dangers of shock or electrocution.

The arrangement of the conductive strips of the various embodiments of the busbar systems and assemblies are configured such that a flat side of the strips face the sides and a back edge is positioned against a front face of a vertical backplane or midplane. This arrangement is configured to save space as compared to conventional systems that may institute busbars that lay flat on a substrate, thereby taking up much more space on the non-conductive substrate while also block air flow in a back-to-front direction. The embodiments herein solve this issue by having the conductive strips parallel with each other. Then, to solve the safety issue, the alignment blocks described in the present disclosure were developed to align power connectors on a circuit board so that the circuit board can be installed in a single movement of pushing it back into the shelf until the power connectors are inserted through the alignment blocks and engage the vertically-oriented conductive strips. Thus, this power connection can be a blind connection, which further reduces the risk of shock since a user does not need to stick their hands back where the power components are located.

As a result of the various configurations described herein, as well as other obvious modifications that would be understood by one of ordinary skill in the art, the busbar assemblies may provide certain benefits. For example, the small form factor of the busbar assemblies may leave more space for midplane mounting and more space for other connectors. The tight tolerances may enable a simple power connection of a circuit board being installed with a power supply. More holes can be cut in the midplane or backplane to get more cooling air flowing through the substrate. Extension posts may be soldered into the board to get power to the CTM and fans. Also, plastic protective modules or shrouds can be used to position busbars accurately before mounting and soldering.

The alignment blocks may be designed as touch-proof or touch-free plastic modules that enclose a segment of conductive strips, or at least surround a left flat side, front edge, and right flat side of the conductive strips. The height of the plastic modules can be designed based on the pitch of circuit boards, circuit packs, or other network elements mounted on a shelf, rack, frame, cabinet, chassis, etc. of a network equipment system.

The embodiments of the present disclosure also provide benefits over floating busbar solutions where a power cable is not contained within a precise location but may have some flexibility with regard to special arrangement. Although some floating busbar systems may be able to solve some of the tolerance problems presented by the smaller shelf platform, the present disclosure provides a solution that takes up about a quarter of the space that would be required for a floating system.

The injection molded plastic protective module may be incorporated in various electrical/optical network systems for solving connection issues, protection issues, and alignment issues. These solutions are advantageous over other conventional system to allow an easy way for a customer to hook up a circuit board and for power to be easily and safely distributed through a network system. The present embodiments solve the touch-proof issue and does so in an inexpensive way by using the injection-molded alignment pieces. The embodiments may be generally applicable to any type of midplane-based or backplane-based system, such as, for example, a system having power levels of about 2 kW per 1RU slot.

Usually, busbars may be positioned at the back of a system and may normally require a joint connector that floats. A floating connector is normally bolted to the frame or cabinet which has large vertical posts and the busbar system is usually positioned between these posts. The aspect of "floating" may include the ability for a component (e.g., power connector of a power cable) to move in the x and y directions when a circuit board (or box) is being plugged into the busbar and the box is misaligned with the busbar. In this case, the large cables and respective connectors require a good amount of space to enable this flexibility. Therefore, instead of following in the pattern of conventional floating connectors, the embodiments of the present disclosure are configured to include a streamlined connection arrangement where power connectors can be precisely aligned with busbars to received power without requiring an additional step of connecting the larger power connectors to a floating connector. The present solution also allows power connections in a platform much smaller that the typical shelves that may be 1.0-1.2 meters deep. For instance, the embodiments may be installed on platforms that are as little as 600 mm deep or smaller.

The busbar assemblies of the present disclosure are also configured such that connection is made on a front facing surface of a non-conductive substrate (e.g., backplane or midplane). Thus, when mounting a circuit board, the circuit board can be pushed back to the non-conductive substrate to make contact with power connections and simultaneously make contact with signal connectors. This enables the circuit board to be plugged into the busbar assembly without a floating connector requiring extra connection steps. As such, conventional floating cables may be heavy six-gauge wire coming off the back of the housing that might take up half of the circuit card if it were mounted on them. The present embodiments take up a fraction of this space compared to the off-the-shelf floating versions. Conventional busbars, for example, may include Open Compute Project (OCP) standards, which would not be able to provide the benefits described herein. The specific alignment features as described herein provide a tight tolerance with respect to aligning the busbars to the vertical non-conductive substrate (e.g., midplane, backplane) and with respect to aligning the circuit boards to the busbars, which thereby eliminates the need for a floating system.

The general tolerances for locating the specific alignment features is described in the present disclosure as being approximately 0.005 inches, in order to not damage or break the signal connector clasps or pins. The present embodiments eliminate the need for a volume-consuming floating connection by having the streamlined busbar system with specific alignment features. As a result, the streamlined design with the fixed connections, as described in the present disclosure, may essentially take up about a third or a fourth of the space needed for a floating connection system.

The vertical busbar structure of the present embodiments may be fixed in a perpendicular manner to the front surface of a backplane/midplane to allow minimum blockage of air flow to adjacent components. Also, the alignment mechanisms are able to position the perpendicular busbar structure to keep it in a set positioned on the backplane/midplane. The alignment mechanisms not only align the busbars on the substrate, but they also provide protective properties by creating touch-proof surfaces that are integrated into the alignment mechanisms. By keeping the busbars perpendicular to the non-conductive substrate, air is allowed to freeing flow through the busbars and allows cooling of connectors mounted on the rear side of the non-conductive substrate.

Therefore, according to some embodiments, a busbar assembly may include a pair of conductive strips configured to carry electrical power, wherein the pair of conductive strips may be arranged on a front-facing surface of a non-conductive vertical substrate. The busbar assembly may further include one or more alignment blocks configured to hold the pair of conductive strips in a fixed position with respect to the non-conductive vertical substrate. Each of the one or more alignment blocks may be configured to guide a pair of power connectors of a circuit board for making electrical contact with the pair of conductive strips when the circuit board is being installed in a housing.

Furthermore, the busbar assembly may be configured such that each of the one or more alignment blocks includes a protective touch-proof feature to reduce the risk of electric shock. The protective touch-proof feature may include a plurality of vertical non-conductive ribs separated from each other to enable air flow through the respective alignment block.

Each of the pair of conductive strips may include a left-facing surface, a right-facing surface, a back edge, and a front edge, and wherein the back edge of each of the pair of conductive strips is arranged in contact with the non-conductive vertical substrate. The right-facing surface of a first conductive strip of the pair of conductive strips may be arranged substantially in parallel with the left-facing surface of a second conductive strip of the pair of conductive strips. The first and second conductive strips may extend perpendicularly from the non-conductive vertical substrate. Each of the one or more alignment blocks may be configured to surround the left-facing surface, right-facing surface, and front edge of a respective portion of the first and second conductive strips.

The busbar assembly described above may further be configured whereby each of the one or more alignment blocks may include one or more openings that form a channel through which a fastening element may be inserted for securing the respective alignment block to the non-conductive vertical substrate. Each of the one or more alignment blocks may include one or more guide pins configured to be inserted into corresponding openings in the non-conductive vertical substrate. The pair of conductive strips may be arranged near a first edge of the front-facing surface of the non-conductive vertical substrate and signal connectors may be arranged near a second edge of the front-facing surface of the non-conductive vertical substrate, where the signal connectors may be configured for connection with corresponding signal connectors of the circuit board. The non-conductive vertical substrate may be one of a backplane or a midplane attached to a shelf for supporting communication equipment.

In addition, the busbar assembly may further include a pair of conductive rearward extensions extending from tops of the pair of conductive strips, the pair of conductive rearward extensions configured to lay over a top edge of the non-conductive vertical substrate. The busbar assembly may also include a pair of vertical plates attached to the pair of conductive rearward extensions and power connectors attached to the pair of vertical plates. The power connectors may be configured to be connected with one or more power modules mounted on the housing to enable the pair of conductive strips to carry electrical power from the one or more power modules to the circuit board.

Network Element Equipment Shelf with Configurable Power Location

Traditional Data/Telecom switching products (network elements) had switching lines from client cards to fabric/switch cards on a backplane Printed Circuit Board (PCB). The rate of transmission of those signals is now so high that signal integrity will degrade too much across copper lines embedded in PCB material and crossing multiple connectors. As such, a new system been developed to allow switching/fabric cards to communicate with client cards via hi-speed data cables. These cables can be less expensive Direct Attach Cables (DAC) or more expensive Active Copper Cables (ACC), Active Electrical Cables (AEC), or even most expensive Active Optical cables (AOC) for correspondingly longer reach. For example, this can be a disaggregated configuration where shelves/modules connect to one another via cabling rather than via backplanes.

To produce the lowest cost switching platform, the lowest cost cable type is chosen. For this application, the lowest cost cables with sufficiently high bandwidth are QSFP-DD DAC (Direct Attach Cables). Each of these cables can transmit up to 400 GbE at a time. The drawback of these cables is that signal integrity requirements only allow a short length before the signal degrades too much for transmission. We therefore need ways to keep the cables as short as possible, and ideally less than 2.0 m to optimize performance and cost. The current costs of those cables are 2 m DAC $X ACC $3X; 7 m AEC $6.5X; 5 m AOC $10X.

The short length of these cables requires a configurable power location on a network element. For illustration purposes, the present disclosure is described with reference to a 192Tbps network element, as illustrated in FIGS. 25-34. When creating a 192T system, in this example, we are placing two 21RU (Rack Unit) shelves in a cabinet, frame, or rack. Also, there is a requirement that each shelf must have cooling and power landing on the rear side. The power modules must plug in from the front where the air is much cooler. If power modules are at the top or bottom of each shelf, then half of the power supplies end up being in the middle of the 2-shelf system. Each set of power supplies can add an extra length to half of the cables (160 cables, e.g., 10 cm or more) which must traverse from the top shelf to the bottom shelf. Besides adding a total of tens of meters of cable (since there are so many cables), it can also make the cable too long to work, since the distance from the top client module to bottom fabric module is 1.1 m plus the distance from the faceplate to the side of the rack cable management x2. This makes it difficult to keep cables under 2.0 m in length.

The present disclosure includes a configurable power module approach for network elements. Specifically, the power modules can be configurable at the top of a shelf or the bottom of the shelf. For example, if one shelf is at the top of the frame, it can have the power modules configured at the top, and the other shelf at the bottom of the frame can have its power modules configured at the bottom. The present disclosure allows in-field reconfiguration between these two locations. The advantage of this approach is it prevents the fabric (cable) connections having to pass over a power section and increase cable length. This configurable power module approach can be with the networking equipment 10, namely a network device, installed on the shelf 12, with the busbar system 14.

Figure 25:
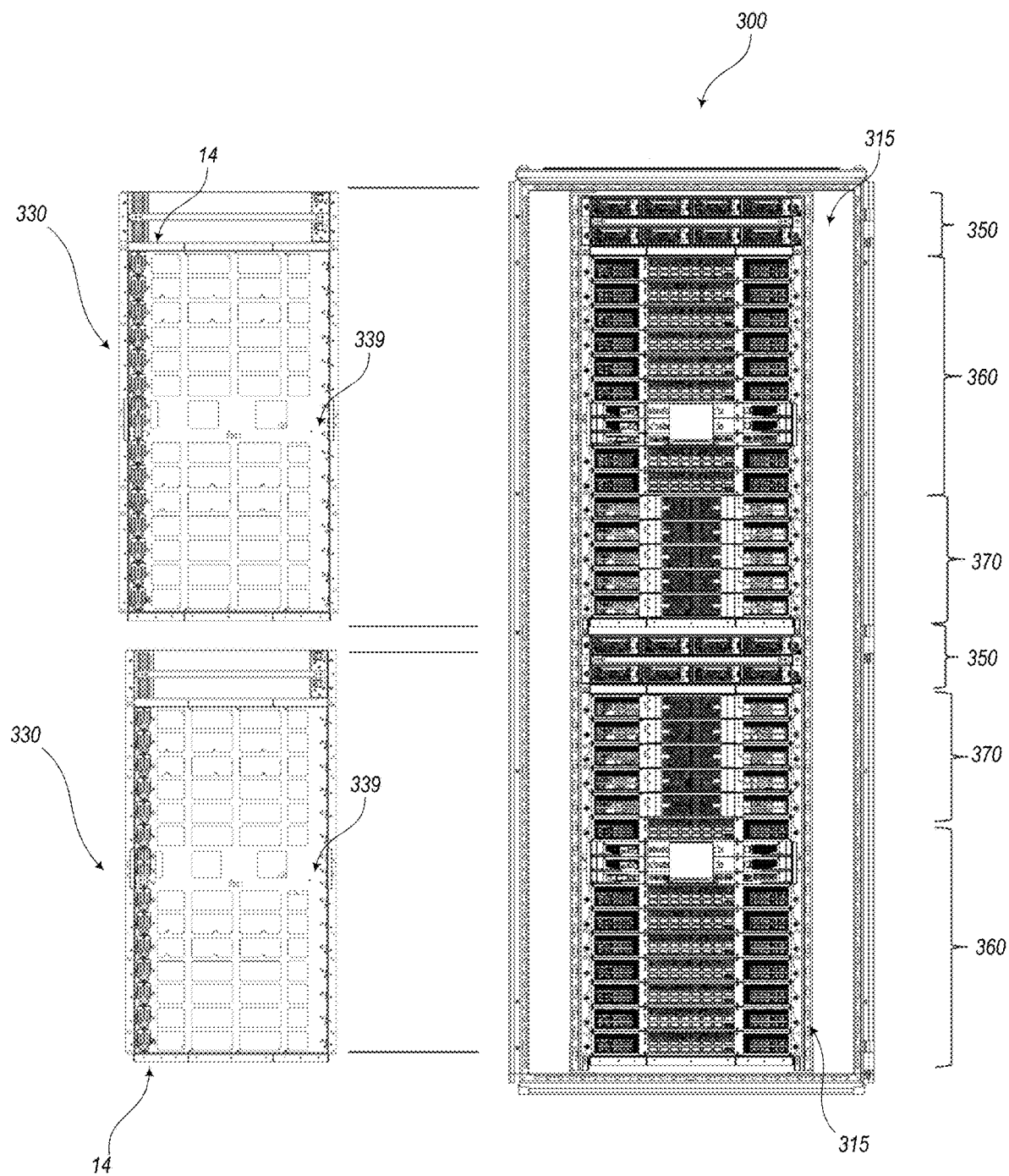
FIG. 25 is a diagram of a front view of a network element in a frame in a conventional configuration where two shelves, including a top shelf and a bottom shelf, both have power modules at the top of each shelf.

FIG. 25 is front view of a network element 300 in a frame in a conventional configuration where two shelves 315, including a top shelf and a bottom shelf, both have power modules 350 at the top of each shelf. The network element 300 includes power modules 350, packet port modules 360, and switch modules 370. This conventional configuration includes the busbar system 14 on both the top and the bottom shelf in a top power entry configuration 330. On the left side of FIG. 25, the top power entry configuration 330 illustrates a backplane 339 of the shelves 315 with no modules, to illustrate the busbar system 14. This conventional configuration will require longer switching cables to traverse the power modules 350, on the bottom shelf. Every switch module 370 of the network element 300 must have a cable to every packet port module system 360. The power modules 350 in the middle of the network element 300 can take up two RUs (each RU=1.75"), and this extra space adds length to the cables. In an embodiment, the network element 300, in a single frame with the two shelves 315, can support ingress, egress, and switching of 192Tbps in packet traffic.

Figure 26:
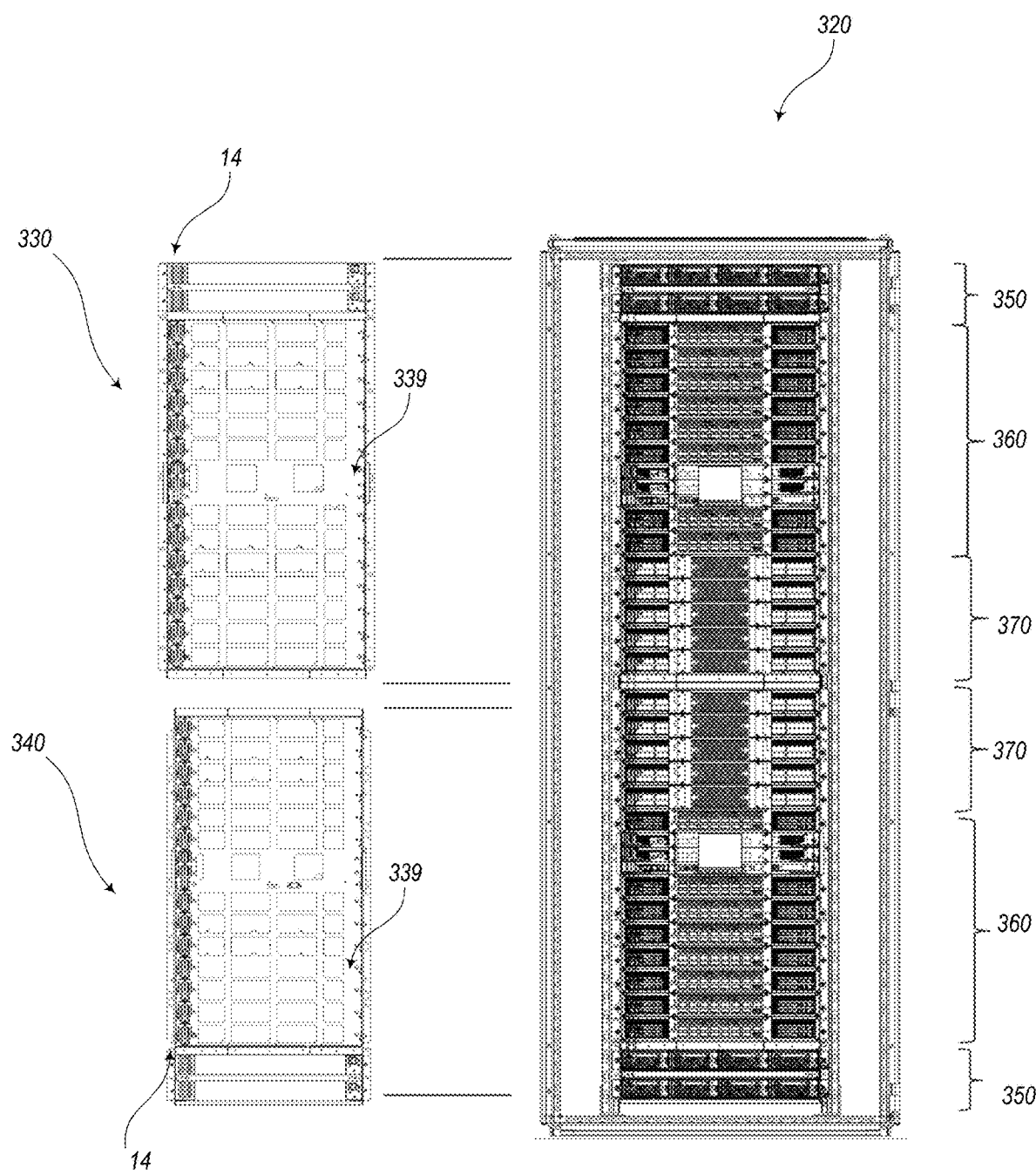
FIG. 26 is a diagram of a front view of the network element with the top shelf configured in the top power entry configuration and the bottom shelf configured in a bottom power entry configuration.
Figure 27:
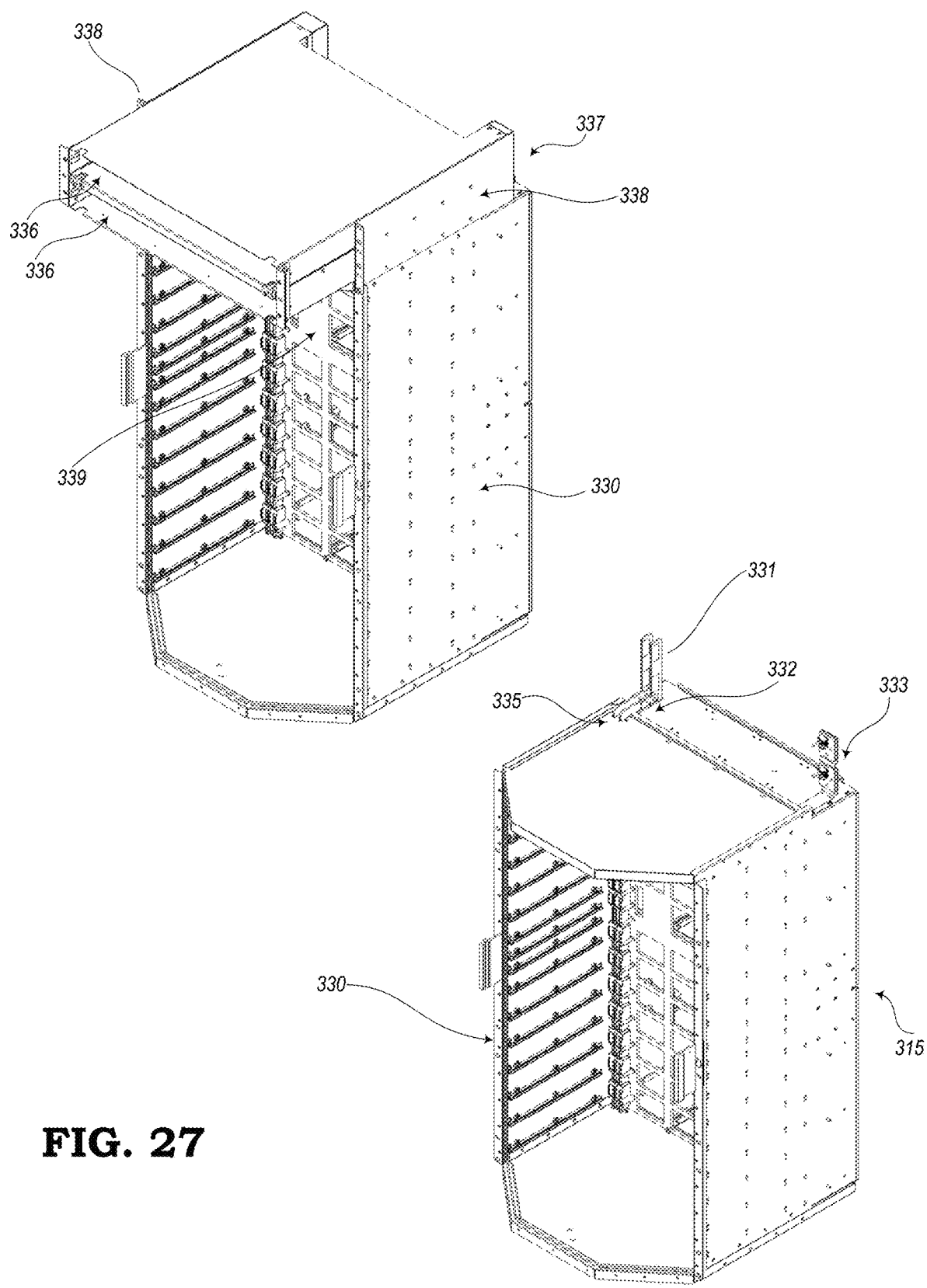
FIG. 27 is a perspective view of a shelf with no modules illustrating busbar extension, with the shell configured for top power.
Figure 28:
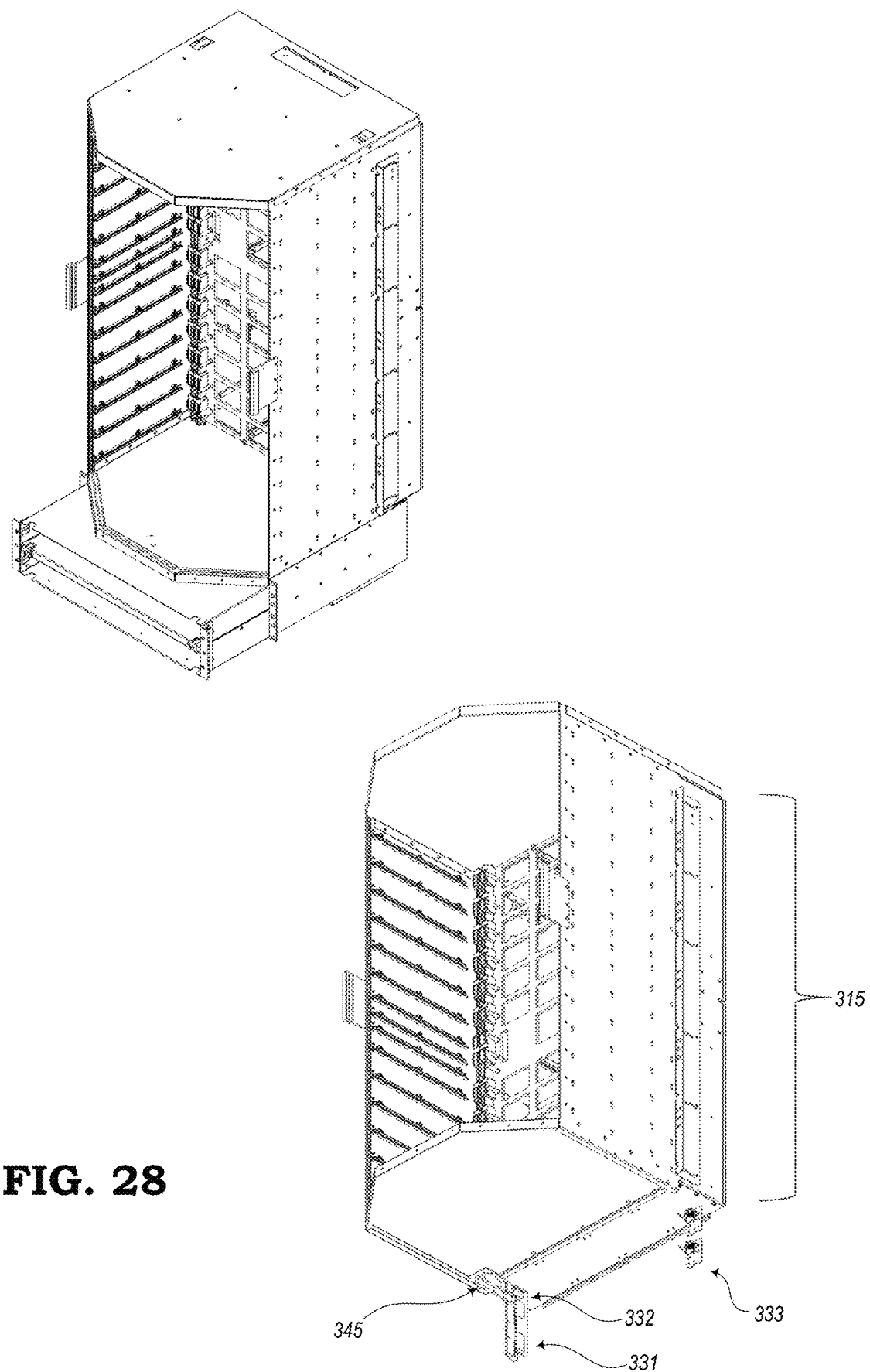
FIG. 28 is a perspective view of a shelf with no modules illustrating busbar extension, with the shelf configured for bottom power.
Figure 29:
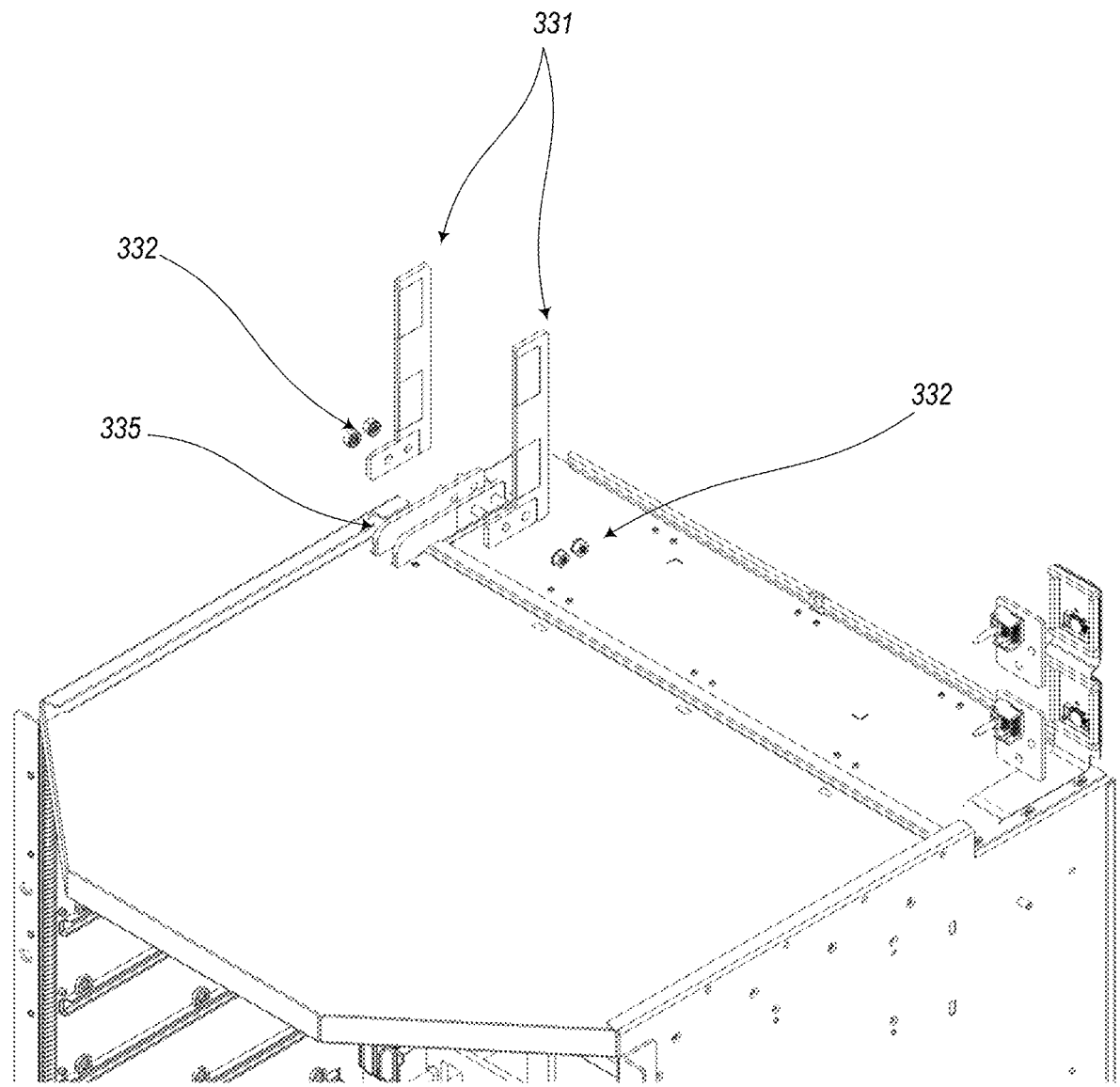
FIG. 29 is a perspective view of the shelf illustrating a close-up view of the busbar extension.
Figure 30:
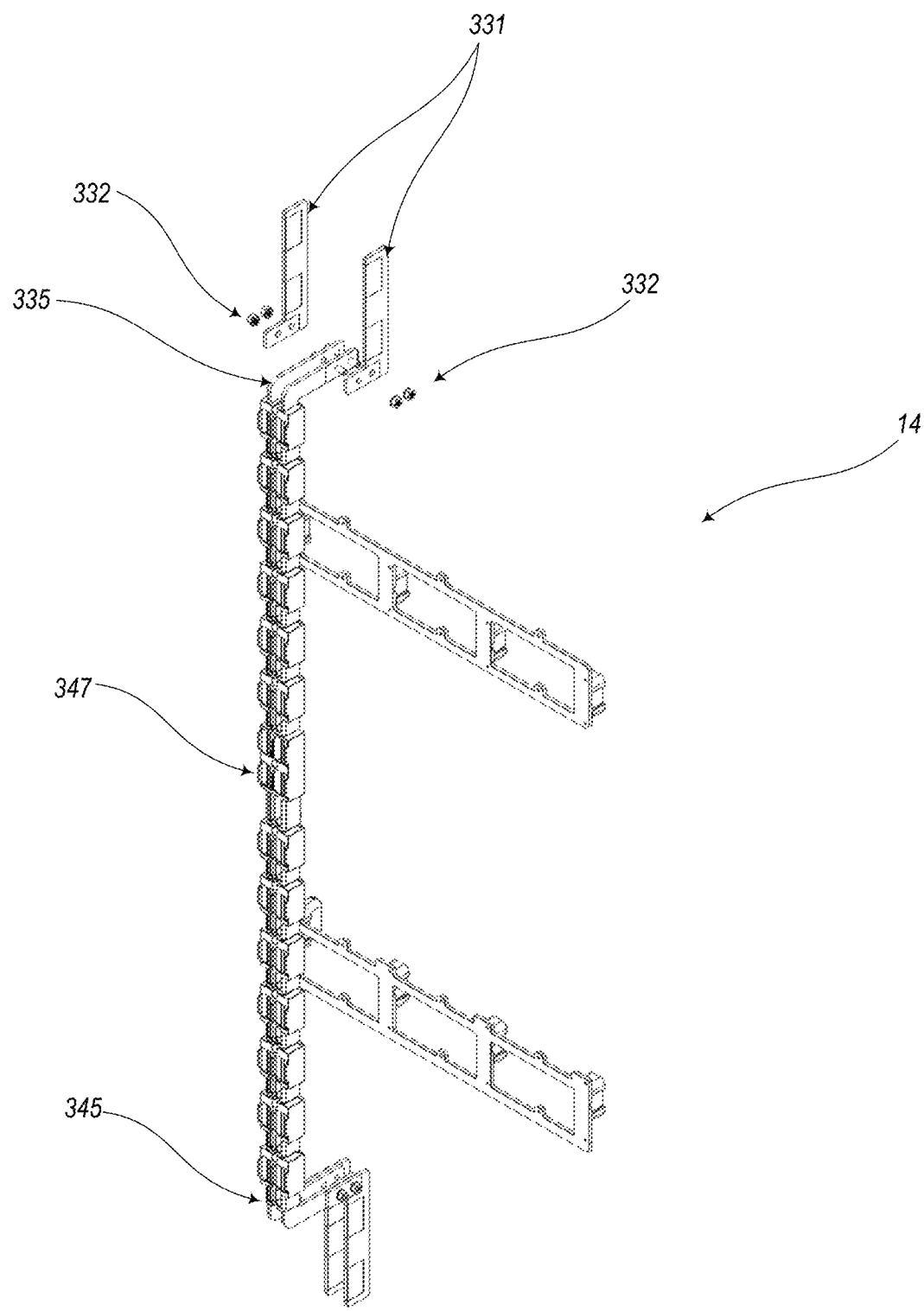
FIG. 30 is a perspective view of the busbar system with the busbar extension.
Figure 31:
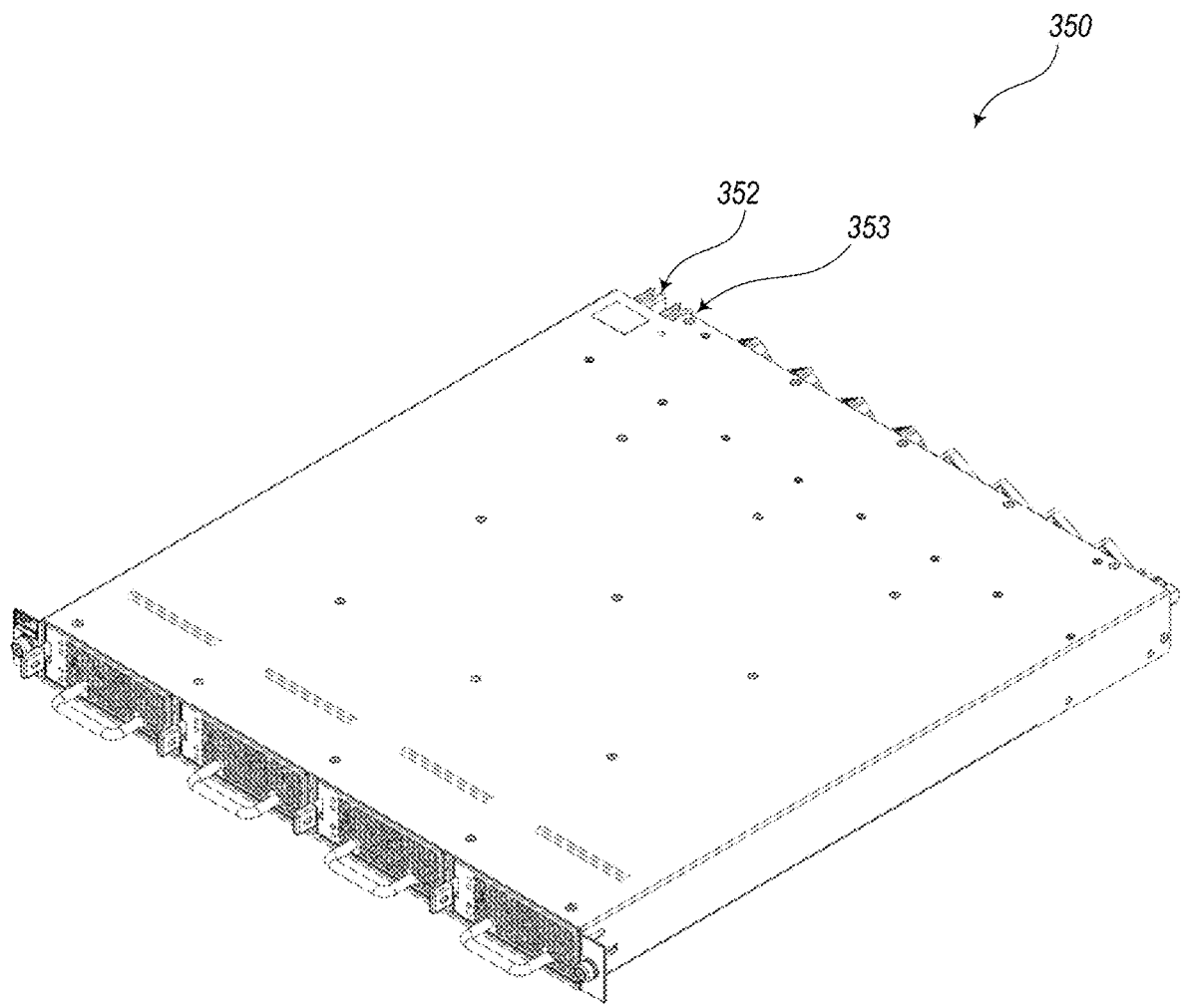
FIG. 31 is a rear perspective view of a power module.
Figure 32:
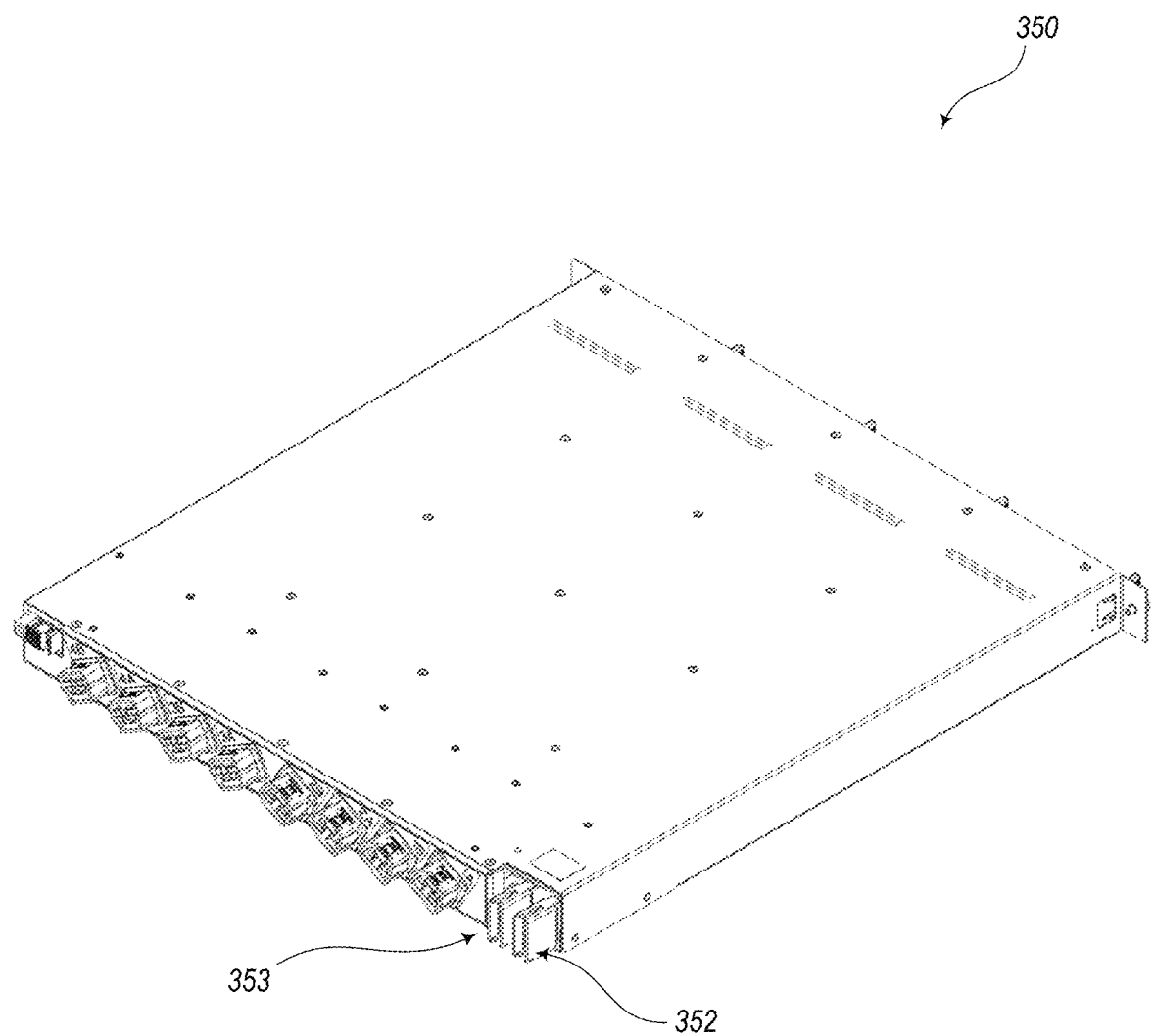
FIG. 32 is a front perspective view of the power module.
Figure 33:
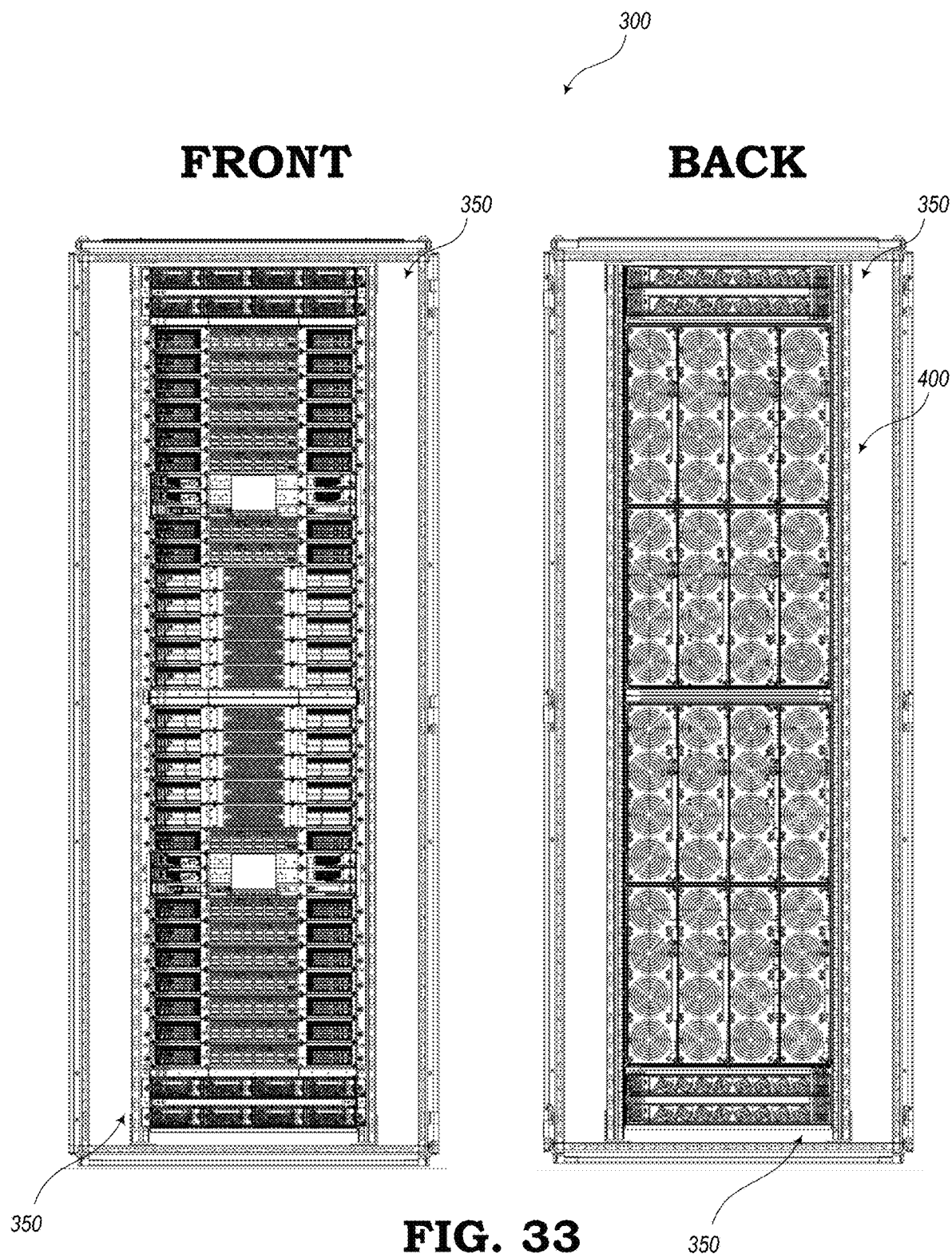
FIG. 33 is a front view and a back view of the network element.
Figure 34:
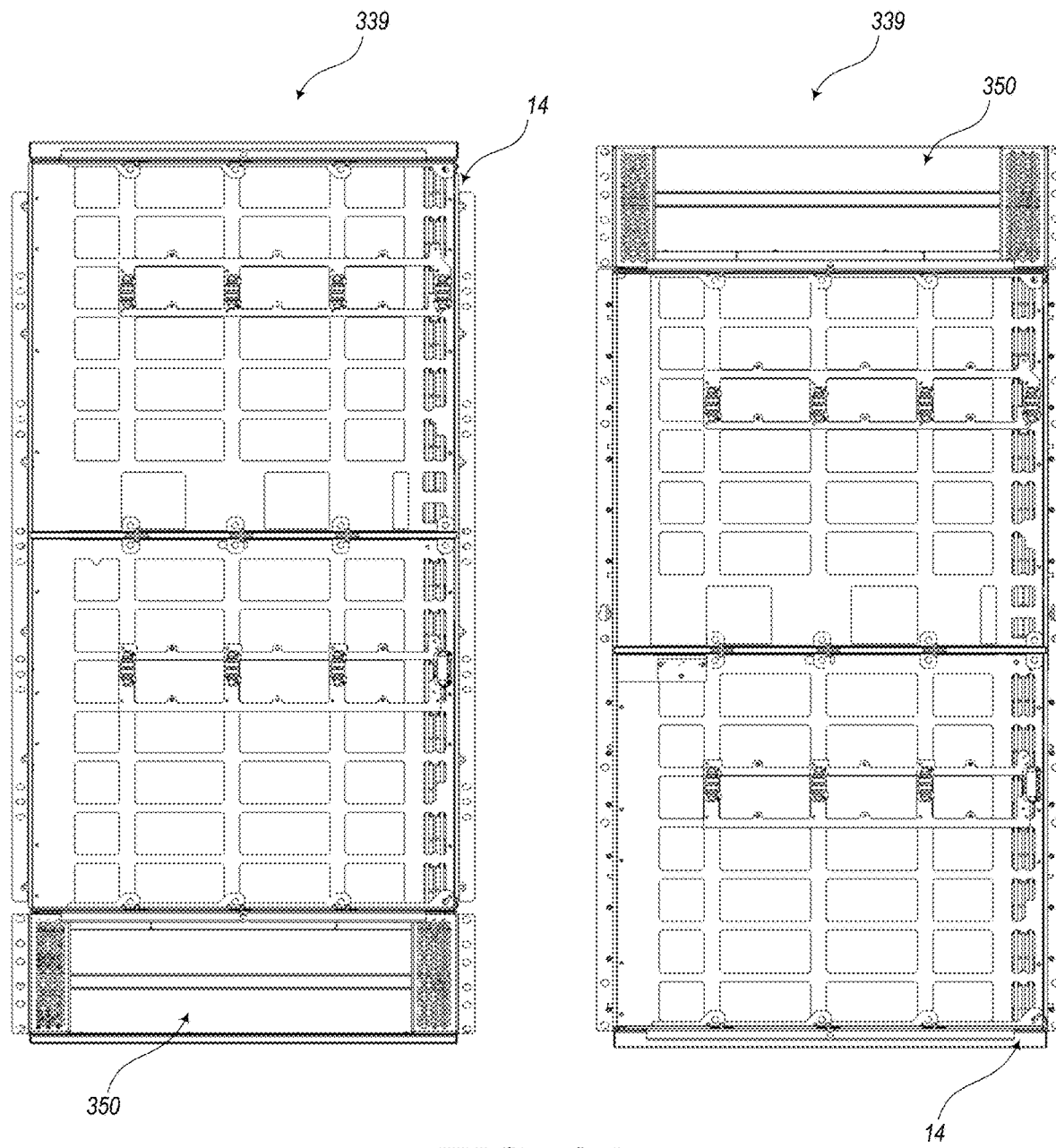
FIG. 34 is a front view of the backplane in a top entry and bottom entry configuration.

FIG. 26 is a front view of the network element 300 with the top shelf configured in the top power entry configuration 330 and the bottom shelf configured in a bottom power entry configuration 340. FIG. 27 is a perspective view of a shelf 315 with no modules illustrating busbar extension 331, with the shelf 315 configured for top power. FIG. 28 is a perspective view of a shelf 315 with no modules illustrating busbar extension 331, with the shelf 315 configured for bottom power. FIG. 29 is a perspective view of the shell 315 illustrating a close-up view of the busbar extension 331. FIG. 30 is a perspective view of the busbar system 14 with the busbar extension 331. FIG. 31 is a rear perspective view of a power module 350, and FIG. 32 is a front perspective view of the power module 350. FIG. 33 is a front view and a back view of the network element 300. FIG. 34 is a front view of the backplane 339 in a top entry and bottom entry configuration.

In FIG. 26, the shelf 315 on the top is in the top power entry configuration 330 and the shelf 315 on the bottom is in the bottom power entry configuration 340. As such, the switch modules 370 on the top shelf 315 and the bottom shelf 315 meet in the middle, with no extra space (i.e., due to the power modules 350), thereby reducing cable lengths between the shelves 315.

The configurability of the power module 350 location is based on the busbar system 14 being able to extend on the top or bottom with the busbar extension 331. In FIG. 27, the bottom right view shows the shelf 315 with the busbar extension 331. The busbar extension 331 attach to a top end 335 of the busbar system 14. The busbar extensions 331 are clamped to these ends with Keps nuts 332, to maintain needed electrical contact. The top left view in FIG. 27 shows the top of the shelf 315 with a power shelf 337, with two slots 336 for power modules 350, assembled to the top of the main shelf 315 using shelf extension brackets 338. The power shelf 337 is used to guide the power modules 350 to the busbar connectors, and to mate the power modules 350 to the power shelf. FIG. 28 shows the opposite of FIG. 27 with the bottom power entry configuration 340, where the busbar extension 331 attaches to a bottom end 345 of the busbar system 14.

FIG. 29 is an exploded view of the busbar extensions 331, the Keps nuts 332, and the top end 335. FIG. 30 is an exploded view of the busbar system 14 with the busbar extensions 331, the Keps nuts 332, the top end 335, and the bottom end 345. The right-angle busbar 331 and extension backplanes 333 allow the power shelf 350 to mate behind the plane of the main backplane 339, which increases space efficiency.

FIGS. 31-32 illustrate the power module 350 that can mate directly to the busbar extension 331 using connectors 352, 353. In this case, one busbar set is −54V while the other is −54V return, of course other values are possible. A power guidance shelf, 37, with two power slots, 36, can assemble to the top or bottom of the main shelf using shelf extension brackets 38. The power shelf is used to guide the power boxes to the bus bar connectors, and to mate the power boxes to the power shell.

The power shelf 337 communicates with the main shelf 315 using a flexible PCB connecting from the main backplane 339, to small extension backplanes 333. One small extension backplane is provided for power shelf 317. A mirror image flex PCB is used for communicating from the main backplane to a lower configured power shelf. All busbars can be covered with an insulating powder coat finish to prevent touching of live power circuits.

FIG. 33 shows a front view of the network element 300 (left side) and a rear view (right side). The rear includes a plurality of fans 400. Of note, the power supplies and cabling is decoupled from the main shelf 315, allowing all of the fans 400 in the rear. FIG. 34 is a front view of the backplane 339 with the power modules 350 at the bottom (left side) and at the top (right side).

Although the present disclosure has been illustrated and described herein with reference to exemplary embodiments providing various advantages, it will be readily apparent to those of ordinary skill in the art that other embodiments may perform similar functions, achieve like results, and/or provide other advantages. Modifications, additions, or omissions may be made to the systems, apparatuses, and methods described herein without departing from the spirit and scope of the present disclosure. All equivalent or alternative embodiments that fall within the spirit and scope of the present disclosure are contemplated thereby and are intended to be covered by the following claims.

What is claimed is:

1. A network device comprising
    a support structure configured to support communication equipment, the support structure including at least a non-conductive vertical substrate;
    a pair of conductive strips arranged on a front-facing surface of the non-conductive vertical substrate and configured in electrical communication with a power source; and
    one or more alignment blocks, wherein each of the one or more alignment blocks includes a touch-proof cage configuration that has spacing dimensions configured to prevent the pair of conductive strips from being touched by a user and reduce the risk of electric shock;
    wherein the pair of conductive strips and the one or more alignment blocks are arranged near a first edge of the front-facing surface of the non-conductive vertical substrate opposite one or more signal connectors arranged near a second edge of the front-facing surface of the non-conductive vertical substrate.

2. The network device of claim 1, wherein each of the one or more alignment blocks includes slots configured to guide one or more power connectors of a circuit board for making electrical contact with the pair of conductive strips when the circuit board is installed on the support structure.

3. The network device of claim 2, wherein each of the one or more alignment blocks is configured to guide the one or more power connectors of the circuit board for making electrical contact with the pair of conductive strips with precision accurate to within a tolerance of about 0.005 inches when the circuit board is installed on the support structure.

4. The network device of claim 1, wherein the touch-proof cage configuration includes a plurality of non-conductive ribs separated from each other to enable air flow through the respective alignment block.

5. The network device of claim 1, wherein the touch-proof cage configuration includes a plurality of non-conductive vertical beams separated from each other to enable air flow through the respective alignment block.

6. The network device of claim 1, wherein the touch-proof cage configuration includes one or more non-conductive horizontal beams that enable air flow through the respective alignment block.

7. The network device of claim 1, wherein each of the one or more alignment blocks includes slits forming channels that are configured to surround left-facing surfaces, right-facing surfaces, and front edges of each of the pair of conductive strips.

8. The network device of claim 1, wherein the one or more alignment blocks are configured to align each of the pair of conductive strips on the non-conductive vertical substrate with precision accurate to within a tolerance of about 0.005 inches.

9. The network device of claim 1, wherein each of the one or more alignment blocks includes one or more openings that form a channel through which a fastening element may be inserted for securing the respective alignment block to the non-conductive vertical substrate.

10. The network device of claim 1, wherein each of the one or more alignment blocks includes one or more guide pins configured to be inserted into one or more corresponding openings in the non-conductive vertical substrate for aligning the respective alignment block on the non-conductive vertical substrate.

11. The network device of claim 1, wherein at least some of the one or more alignment blocks include one or more protrusions that extend upward or downward above or below a top or bottom surface of the touch-proof cage configuration.

12. The network device of claim 11, wherein at least some of the one or more alignment blocks include one or more slits open on a top or bottom surface of the touch-proof cage configuration.

13. The network device of claim 12, wherein, when a first alignment block is positioned on top of or below a second alignment block, the one or more protrusions and the one or more slits of the first alignment block and the second alignment block are configured to be mated to align the first alignment block with the second alignment block.

14. The network device of claim 1, wherein each of the one or more alignment blocks has a height that is sized for a pitch of a circuit board installed on the support structure.

15. The network device of claim 14, wherein the pitch of the circuit board installed on the support structure is 1RU, 2RU, or 4RU.

16. The network device of claim 1, wherein each of the one or more alignment blocks is made from an injection molded plastic, thermoplastic, or elastomer material.

17. A method comprising
    providing a support structure configured to support communication equipment, the support structure including at least a non-conductive vertical substrate; and
    arranging a pair of conductive strips on a front-facing surface of the non-conductive vertical substrate and configured in electrical communication with a power source using one or more alignment blocks, wherein each of the one or more alignment blocks includes a touch-proof cage configuration that has spacing dimensions configured to prevent the pair of conductive strips from being touched by a user and reduce the risk of electric shock;

wherein the pair of conductive strips and the one or more alignment blocks are arranged near a first edge of the front-facing surface of the non-conductive vertical substrate opposite one or more signal connectors arranged near a second edge of the front-facing surface of the non-conductive vertical substrate.

18. The method of claim 17, wherein each of the one or more alignment blocks includes slots configured to guide one or more power connectors of a circuit board for making electrical contact with the pair of conductive strips when the circuit board is installed on the support structure.

19. The method of claim 17, wherein the touch-proof cage configuration includes a plurality of non-conductive ribs, a plurality of non-conductive vertical beams, and/or one or more horizontal beams that enable air flow through the respective alignment block.

20. A network device comprising a support structure configured to support communication equipment, the support structure including at least a non-conductive vertical substrate;

a pair of conductive strips arranged on a front-facing surface of the non-conductive vertical substrate and configured in electrical communication with a power source; and one or more alignment blocks, wherein each of the one or more alignment blocks includes a touch-proof cage configuration that has spacing dimensions configured to prevent the pair of conductive strips from being touched by a user and reduce the risk of electric shock;

wherein each of the one or more alignment blocks has a height that is sized for a pitch of a circuit board installed on the support structure.

* * * * *